(12) United States Patent
Park et al.

(10) Patent No.: US 11,069,472 B2
(45) Date of Patent: Jul. 20, 2021

(54) COIL PATTERN, METHOD FOR FORMING SAME, AND CHIP DEVICE INCLUDING SAME

(71) Applicant: MODA-INNOCHIPS CO., LTD., Ansan-Si (KR)

(72) Inventors: In Kil Park, Seongnam-Si (KR); Seung Hun Cho, Siheung-Si (KR); Gyeong Tae Kim, Ansan-Si (KR); Jun Ho Jung, Siheung-Si (KR); Sang Jun Park, Hwaseong-Si (KR)

(73) Assignee: MODA-INNOCHIPS CO., LTD.

( * ) Notice: Subject to any disclaimer, the term of this patent is extended or adjusted under 35 U.S.C. 154(b) by 235 days.

(21) Appl. No.: 16/077,439

(22) PCT Filed: Mar. 13, 2017

(86) PCT No.: PCT/KR2017/002666
§ 371 (c)(1),
(2) Date: Aug. 10, 2018

(87) PCT Pub. No.: WO2017/171265
PCT Pub. Date: Oct. 5, 2017

(65) Prior Publication Data
US 2019/0051446 A1 Feb. 14, 2019

(30) Foreign Application Priority Data

Mar. 31, 2016 (KR) .......................... 10-2016-0039653

(51) Int. Cl.
| | | |
|---|---|---|
| *H01F 27/32* | (2006.01) | |
| *H01F 27/28* | (2006.01) | |
| *H01F 17/00* | (2006.01) | |
| *H01F 41/04* | (2006.01) | |
| *H01F 17/04* | (2006.01) | |
| *C25D 3/38* | (2006.01) | |
| *C25D 5/02* | (2006.01) | |
| *C25D 5/10* | (2006.01) | |

(Continued)

(52) U.S. Cl.
CPC .......... *H01F 27/2804* (2013.01); *C25D 3/38* (2013.01); *C25D 5/022* (2013.01); *C25D 5/10* (2013.01);
(Continued)

(58) Field of Classification Search
CPC ............. H01F 27/2804; H01F 17/0013; H01F 41/043; H01F 17/04; H01F 27/32;
(Continued)

(56) References Cited

U.S. PATENT DOCUMENTS

| | | | |
|---|---|---|---|
| 9,899,136 B2 * | 2/2018 | Lee | ........................ H01F 17/04 |
| 10,388,447 B2 * | 8/2019 | Choi | ........................ H01F 5/00 |

(Continued)

FOREIGN PATENT DOCUMENTS

| | | |
|---|---|---|
| CN | 1523617 A | 8/2004 |
| CN | 101162645 A | 4/2008 |

(Continued)

OTHER PUBLICATIONS

Written Opinion for PCT/KR2017/002666 dated Jun. 20, 2017.
International Search Report for PCT/KR2017/002666 dated Jun. 20, 2017.

*Primary Examiner* — Tuyen T Nguyen
(74) *Attorney, Agent, or Firm* — Renaissance IP Law Group LLP

(57) ABSTRACT

Provided is a method of forming a coil pattern on at least one surface on a substrate, the method comprising forming a seed layer on at least one surface of a substrate, and forming (Continued)

at least two or more plating layers to cover the seed layer, wherein the two or more plating layers are formed through anisotropic plating.

20 Claims, 13 Drawing Sheets

(51) Int. Cl.
    *C25D 7/00*     (2006.01)
    *H05K 1/16*     (2006.01)
    *H05K 3/24*     (2006.01)

(52) U.S. Cl.
    CPC .......... *C25D 7/00* (2013.01); *H01F 17/0013* (2013.01); *H01F 17/04* (2013.01); *H01F 27/32* (2013.01); *H01F 41/041* (2013.01); *H01F 41/043* (2013.01); *H01F 2017/0066* (2013.01); *H01F 2017/0073* (2013.01); *H01F 2017/048* (2013.01); *H01F 2027/2809* (2013.01); *H01F 2027/2819* (2013.01); *H05K 1/165* (2013.01); *H05K 3/241* (2013.01); *H05K 2203/1476* (2013.01)

(58) Field of Classification Search
    CPC .......... H01F 41/041; H01F 2017/0073; H01F 2017/048; H01F 2017/0066; H01F 2027/2809; H01F 2027/2819; C25D 3/38; C25D 5/022; C25D 5/10; C25D 7/00; H05K 1/165; H05K 2203/1476; H05K 3/241

See application file for complete search history.

(56) References Cited

U.S. PATENT DOCUMENTS

| | | |
|---|---|---|
| 2015/0035640 A1 | 2/2015 | Wang et al. |
| 2015/0270053 A1 | 9/2015 | Cha et al. |
| 2015/0348706 A1 | 12/2015 | Sano et al. |

FOREIGN PATENT DOCUMENTS

| | | | |
|---|---|---|---|
| CN | 104766715 | A | 7/2015 |
| JP | S566936 | U | 1/1981 |
| JP | S644091 | A | 1/1989 |
| JP | H07135114 | A | 5/1995 |
| JP | 2003197438 | A | 7/2003 |
| JP | 2007128928 | A | 5/2007 |
| JP | 2009010137 | A | 1/2009 |
| JP | 2009117546 | A | 5/2009 |
| JP | 2012089765 | A | 5/2012 |
| JP | 2015037179 | A | 2/2015 |
| JP | 2015111694 | A | 6/2015 |
| JP | 2015130471 | A | 7/2015 |
| JP | 2015228477 | A | 12/2015 |
| JP | 2016213443 | A | 12/2016 |
| KR | 20070032259 | A | 3/2007 |
| KR | 20140024151 | A | 2/2014 |
| KR | 101559879 | B1 | 7/2015 |
| KR | 20150108518 | A | 9/2015 |
| KR | 101558092 | B1 | 10/2015 |
| KR | 101565673 | B1 | 11/2015 |
| KR | 20150134858 | A | 12/2015 |
| KR | 101598295 | B1 | 2/2016 |
| KR | 20160018382 | A | 2/2016 |
| TW | 468186 | B | 12/2001 |
| TW | I312181 | B | 7/2009 |
| TW | I320219 | B | 2/2010 |
| TW | I342598 | B | 5/2011 |

* cited by examiner

COIL PATTERN, METHOD FOR FORMING SAME, AND CHIP DEVICE INCLUDING SAME

TECHNICAL FIELD

The present disclosure relates to a method of forming a coil pattern, and more particularly, to a coil pattern and a method of forming the same which are capable of being formed through anisotropic plating without using a high-power rectifying device and high-output supplying device.

BACKGROUND

Power inductors, one of chip devices, are mainly provided in power supply circuits, such as a DC-DC converter in a portable apparatus. Such power inductors have been increasingly used in place of wound-type choke coils according to higher frequency applications and downsizing of the power supply circuits. In addition, power conductors have been developed in directions of downsizing, high currents, low resistance, or the like according to the downsizing and multi-functionality of portable apparatuses.

In general, power conductors each are configured to include a body formed of a ferrite material, a substrate provided in the body, a coil pattern formed on the substrate, and an external electrode formed outside the body to be connected to the coil pattern, and the like. Electrical characteristics of such power inductors may be determined by material properties of the body, the structure of the coil pattern, or the like.

The coil pattern may be formed on at least one surface of the substrate through a plating process, and the plating process may be divided into isotropic plating and anisotropic plating. In the isotropic plating, plating layers may be uniformly grown in all directions, and in the anisotropic plating, the growth in a specific direction may be given a merit. That is, in the isotropic plating, plating layers uniformly grow in the upward and sideward directions and in the anisotropic plating, plating layers selectively grow better in the upward direction.

Meanwhile, in order to form a plating layer having an aspect ratio of approximately 2 to approximately 7 through the anisotropic plating, a high current density of approximately 30 A/cm2 to approximately 60 A/cm2 is required, and a great amount of plating solutions should be quickly supplied. For this, a high-current rectifying device and a high-output supplying device are required. That is, in order to form a plating layer through the anisotropic plating, metal ions should be sufficiently supplied, and for this, the high-current rectifying device is required, and the high-output supplying device is required to supply a great amount of plating solution and supply the plating solution with a high flow speed. When a small amount of plating solution is supplied with a low flow speed, plating ions supplied on to a substrate is decreased and thereby, a burnt phenomenon occurs. Therefore it is difficult to form a normal pattern, and thus, a great amount of plating solution should be supplied with a high speed. Accordingly, in order to form a plating layer with an aspect ratio of equal to or greater than approximately 2, approximately 1 to approximately 2 l/min of plating solution should be supplied by using a high-output supplying device.

As such, for the anisotropic plating, a high-current rectifying device and a high-output supplying device are required, a great amount of plating solution is consumed, and a great amount of organic compounds in a plating solution are also consumed, and thus, there is a limitation in that manufacturing costs are increased.

Technical Problem

The present disclosure provides a method of forming a coil pattern capable of being formed through anisotropic plating while reducing the consumption of a plating solution.

The present disclosure also provides a method of forming a coil pattern, the method being capable of forming a plating layer with a large aspect ratio without using a high-power rectifying device and high-output supplying device.

The present disclosure also provides a coil pattern formed through anisotropic plating while reducing the consumption of plating solution without using a high-power rectifying device and high-output supplying device.

Technical Solution

In accordance with an exemplary embodiment, a method of forming a coil pattern on at least one surface on a substrate includes: forming a seed layer on at least one surface of a substrate; and forming at least two or more plating layers to cover the seed layer, wherein the two or more plating layers are formed through anisotropic plating.

The seed layer may be formed in a spiral shape.

Said at least two or more plating layers may be formed after at least two or more photosensitive film patterns are respectively formed on the substrate so as to be spaced apart from innermost and outer most sides of the seed layer.

A ratio of a height of said at least two or more photosensitive film patterns to a total width of said at least two or more plating layers may be approximately 1:0.5 to 1:2.

The coil pattern may be formed in an aspect ratio of approximately 2 to approximately 10.

The coil pattern may have at least one region formed in a different width.

The coil pattern may be formed to have a width gradually increasing or decreasing from an innermost side toward an outermost side.

The coil pattern may have at least one region formed to have widths different from each other in lower end portion, middle portion, and upper end portion of the region.

In accordance with another exemplary embodiment, a coil pattern includes: a seed layer formed on at least one surface of a substrate; and at least two or more plating layers formed to cover the seed layer and formed through an anisotropic plating process performed at least twice.

The coil pattern may be formed to have a width gradually increasing or decreasing from an innermost side toward an outermost side.

The coil pattern may have at least one region formed to have widths different from each other in lower end portion, middle portion, and upper end portion of the region.

When a width of an innermost portion of the coil pattern is A, a width of a central portion of the coil pattern is B, a width of an outermost portion of the coil pattern is C, the upper end portion may be formed to have a relationship B≥C>A, the middle portion may be formed to have a relationship C>B≥A, and the lower end portion may be formed in a relationship C>B≥A.

In accordance with yet another exemplary embodiment, a chip device includes: a body; at least one substrate provided in the body; at least one coil pattern formed on at least one surface of the substrate; and an insulating layer formed between the coil pattern and the body, wherein the coil pattern comprises a seed layer formed on at least one surface of the substrate and at least two or more plating layers formed to cover the seed layer and formed through an anisotropic process performed at least twice.

At least some regions of the substrate may be removed and the removed regions may be filled with the body.

The coil pattern may be formed to have a width gradually increasing or decreasing from an innermost side toward an outermost side.

When a width of an innermost portion of the coil pattern is A, a width of a central portion of the coil pattern is B, a width of an outermost portion of the coil pattern is C, the upper end portion may be formed to have a relationship B≥C>A, the middle portion may be formed to have a relationship C>B≥A, and the lower end portion may be formed in a relationship C>B≥A.

At least two substrates may be provided to be laminated in a thickness direction of the body, and coil patterns respectively formed on the two or more substrates may be connected in series or in parallel.

Advantageous Effects

A coil pattern in accordance with exemplary embodiments is formed in a predetermined shape by forming a seed layer on a substrate and then forming a plurality of plating layers on the seed layer through anisotropic plating. Accordingly, it is possible to form the coil pattern with a high aspect ration of approximately 2 to approximately 10 while reducing the supplying amount of plating solution. That is, in exemplary embodiments, anisotropic plating may be implemented with a small supplying amount of plating solution without using an existing high-current rectifying device and a high-output plating solution supplying device. Furthermore, since an opened area of a photosensitive film pattern for forming a coil pattern is greater than the height of the coil pattern, the uniformity of the thickness and shape of plating is excellent, and electrical characteristics of chips may be suitably realized under chip miniaturization trend.

BRIEF DESCRIPTION OF THE DRAWINGS

Exemplary embodiments can be understood in more detail from the following description taken in conjunction with the accompanying drawings, in which.

Hereinafter, exemplary embodiments of the present invention will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

FIGS. 1 to 6 are plan views and cross-sectional views for describing a method of forming a coil pattern in a process order in accordance with an exemplary embodiment. That is, (a) of FIGS. 1 to 6 are plan views shown in the process order, and (b) of FIGS. 1 to 6 are cross-sectional views shown in the process order. Also, FIG. 7 is a cross-sectional photograph of a central portion of a coil pattern formed in accordance with an exemplary embodiment.

Figure 1:
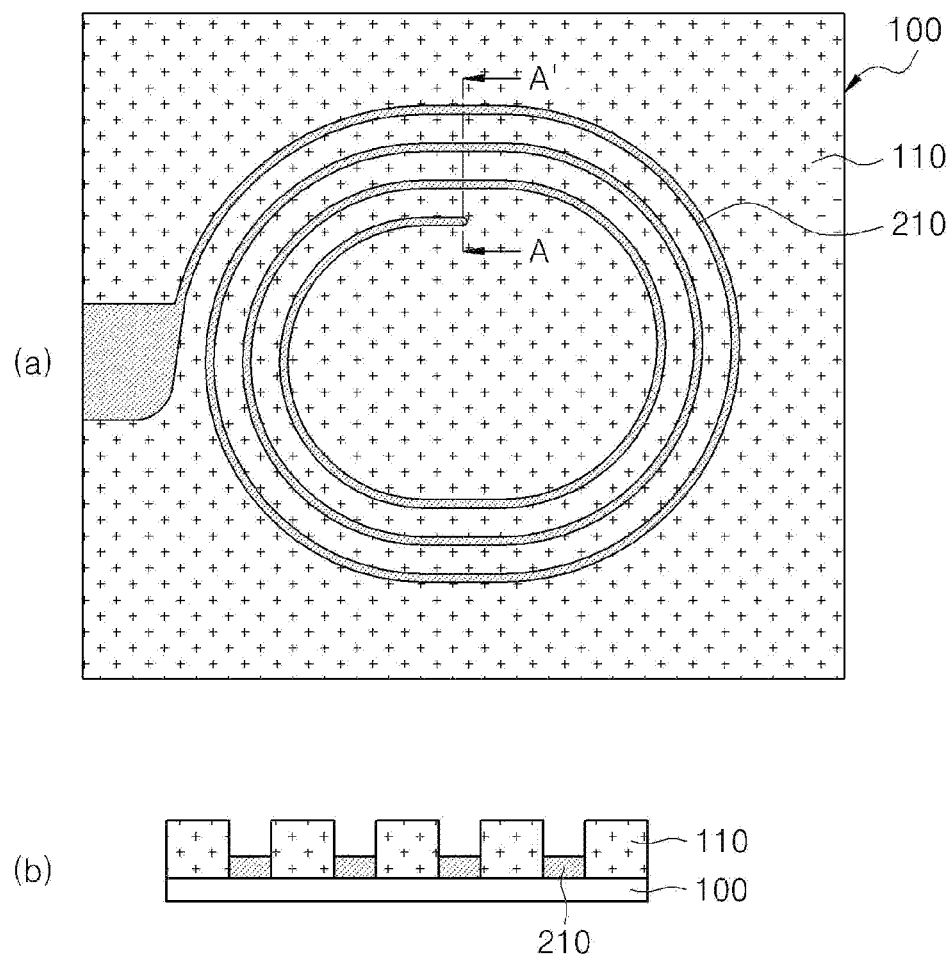
FIGS. 1 to 6 are plan views and cross-sectional views for describing a method of forming a coil pattern in a process order in accordance with an exemplary embodiment.

Referring to FIG. 1, a first photosensitive film pattern 110 is formed on a substrate 100, and a seed layer 210 is formed on the substrate exposed by the first photosensitive film pattern 110. Here, the first photosensitive film pattern 110 and the seed layer 210 may be formed on at least one surface of the substrate 100. That is, the first photosensitive film pattern 110 and the seed layer 210 may be formed on one surface of the substrate 100 or on both surface of the substrate 100. When formed on both surface, the first photosensitive film pattern 110 and the seed layer 210 may be formed in the same shape to overlap each other. Of course, the seed layer 210 may be formed on the other surface corresponding to the region in which the seed layer 210 is not formed on one surface of the substrate 100. In the description below, the case in which a coil pattern is formed on one surface of the substrate 100 will be exemplarily described.

The substrate 100 may be provided in a shape in which a metal foil is attached to upper and lower portions of a base having a predetermined thickness. Here, the base may include, for example, glass-reinforced fiber, plastic, metal ferrite. That is, a copper clad lamination (CCL) in which a copper foil is bound to glass-reinforced fiber may be used as the substrate 100, and the substrate 100 may be formed such that a copper foil is bonded to plastic such as polyimide or a copper foil is bonded to metal ferrite. Also, at least one conductive via (not shown) may be formed in a predetermined region of the substrate 100. When the conductive via is formed and thereby, seed layers 210 are formed on one and the other surfaces of the substrate 100, the seed layers 210 may be electrically connected. The conductive via may be formed by forming a via (not shown) passing through the substrate 100 in the thickness direction on the substrate 100 and then allowing the via to be filled when the seed layers 210 are formed, or may also be formed by filling the via with a conductive paste. That is, the conductive via may be formed through past filling or plating methods. In this case, at least a portion of the seed layers 210 may be grown from the conductive via, and accordingly, at least a portion of the conductive via and the seed layers 210 may be integrally formed. Also, at least a portion of the substrate 100 may be removed. For example, in the substrate 100, remaining regions except for the region overlapping the region in which the coil pattern will be formed later may be removed.

In addition, the first photosensitive film pattern 110 may be formed by performing exposure and development processes after a photosensitive film is formed on the substrate 100. For example, first photosensitive film pattern 110 with a predetermined shape may be formed by performing exposition and development processes using a predetermined mask after a photosensitive film with a predetermined thickness is attached on to the substrate 100. Here, the first photosensitive film pattern 110 may be formed in a shape of a coil pattern, for example, may be formed in a spiral shape such that a predetermined region of the substrate 100 is exposed. Also, the first photosensitive film pattern 110 may be formed such that the substrate 100 is exposed by a width smaller than that of the coil pattern to be formed later. For example, the first photosensitive film pattern 110 may be formed such that the substrate 100 is exposed by a width of approximately ⅕ to ½ of the width of the coil pattern to be formed. Meanwhile, the first photosensitive film pattern 110 may be formed in a spiral shape so as to have a width which gradually increases or decreases from the innermost side toward the outermost side of the exposed substrate 100, that is, in the direction from A toward A' in the cut line of FIG. 1. Also, the first photosensitive film pattern 110 may be formed such that at least any one width becomes gradually greater or smaller in the direction from A toward A' in the cut line of FIG. 1. Meanwhile, end portions of the first photosensitive film pattern 110, that is, the end portion with a spiral shape may be formed to have a width greater than those of other regions. For example, the end portions of the first photosensitive film pattern 110 may be formed to have the same width as that of the end portions of the plurality of plating layers to be formed later.

In addition, the seed layer 210 is formed on the substrate exposed by the first photosensitive film pattern 110. That is, the seed layer 210 is formed in a spiral shape. In this case, the endmost portion of the seed layer 210 may be formed to have a width greater than those of other portions of the seed layer 210. Meanwhile, the seed layer 210 may be formed by using the same material as that of the plating layer to be formed later. For example, the seed layer 210 may be formed by using copper. Also, since the first photosensitive film pattern 110 exposes the substrate 100 by a width greater than the width of the coil pattern to be formed later, the seed layer 210 may be formed in a smaller width than that of the coil pattern to be formed later, for example, in a width decreased by approximately ⅕ to ½ of the width of the coil pattern. Also, the seed layer 210 may be formed to have a width-to-distance ratio of, for example, approximately 1:1.5 to approximately 1:5. That is, the seed layer 210 may be formed to have the distance between adjacent portions thereof greater than the width thereof. However, the width-to-distance ratio of the seed layer 210 may be variously changed according to the number of turns, the width, and the distance of the coil pattern. Meanwhile, the seed layer 210 may be formed to have the same width or in a width which gradually increases or decreases from the innermost side toward the outermost side of the substrate 100, that is, in the direction from A toward A' in the cut line of FIG. 1. Also, the seed layer 210 may be formed such that the width of at least any one portion thereof is greater or smaller than other portions. Of course, the end portion of the seed layer 210 may be formed to have a width greater than those of other portions of the seed layer 210.

Figure 2:
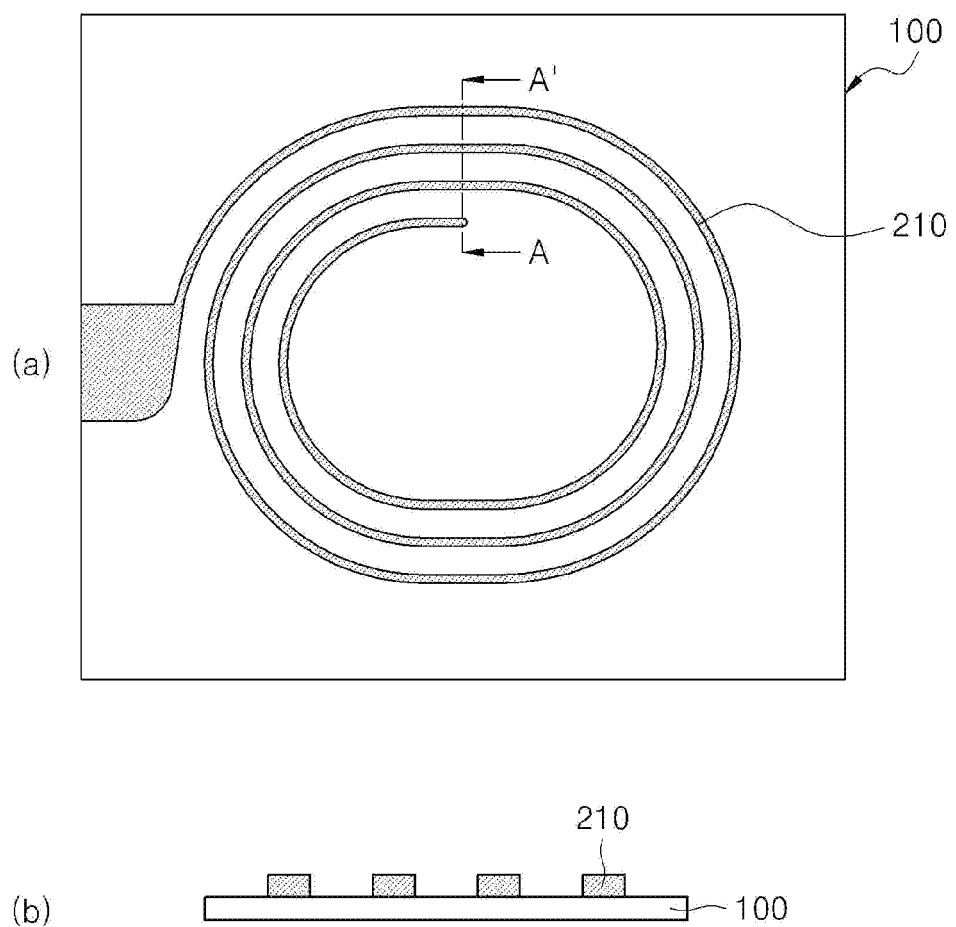

Referring to FIG. 2, the first photosensitive film pattern 110 is removed, and thereby, the seed layer 210 is remained on the substrate 100.

The first photosensitive film pattern 110 is removed by using a material having a large etching selection ratio with respect to the seed layer 210. Accordingly, the first photosensitive film pattern 110 may be removed almost without removing the seed layer 210. Also, after the first photosensitive film pattern 110 is removed, a metal foil under the first photosensitive film pattern 110 may be removed. That is, the seed layer 210 is maintained, the metal foil exposed by the seed layer 210 is removed, and thereby, the base of the substrate 100 may be exposed.

Figure 3:
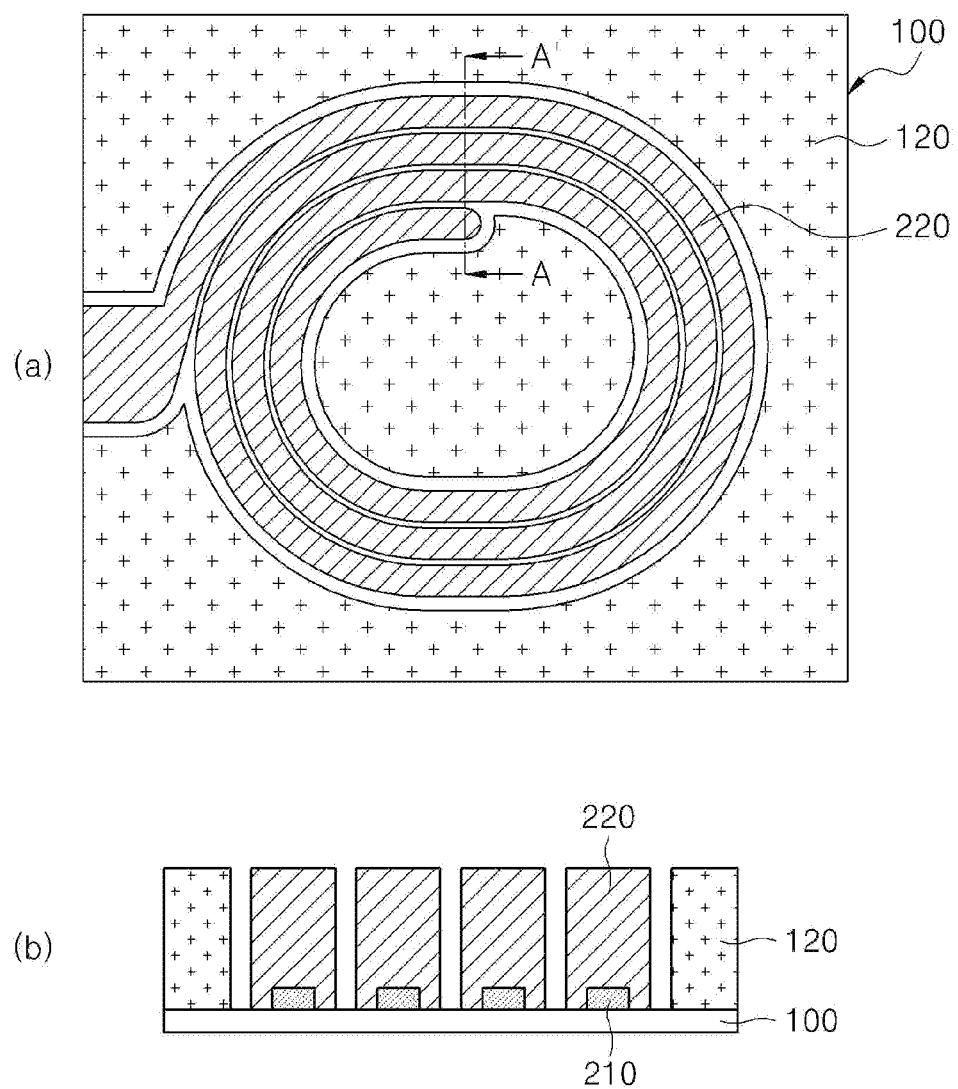

Referring to FIG. 3, a second photosensitive film pattern 120 is formed on the substrate 100 so as to be spaced a predetermined distance apart from the seed layer 210, and then a first plating layer 220 is formed on the seed layer 210. Here, the first plating layer 220 is grown from the seed layer 210 and is formed through anisotropic plating in which a plating layer is grown further in the upward direction than in the sideward direction.

The second photosensitive film pattern 120 may be formed in a region in which a coil pattern will be formed, that is, remaining regions except for the region in which the seed layer 210 is formed. In this case, since the first plating layer 220 is formed on the seed layer 210 through an anisotropic plating process, the second photosensitive film pattern 120 may be formed so as to be spaced a predetermined distance apart from the innermost and outermost sides of the seed layer 210. That is, the second photosensitive film pattern 120 may be formed in the central and outer regions of the seed layer 210 on the substrate 100 so as to be spaced a predetermined distance apart from the innermost and outermost sides of the seed layer 210 formed in a spiral shape. In other words, the second photosensitive film pattern 120 may not be formed between each seed layer 210 in the direction of cut line A-A', but may be formed only in the inner and outer regions of the substrate 100. Also, the second photosensitive film pattern 120 may be formed to have the same height as the growing height of the first plating layer 220. That is, the second photosensitive film pattern 120 may be formed to have the same height as the height of the first plating layer 220 to be formed. In this case, the second photosensitive film pattern 120 may be formed in a thickness of approximately 20% to approximately 40% with respect to the width of the region in which the first plating layer 220 is formed. That is, the second photosensitive film pattern 120 may be formed in a thickness of approximately 20% to approximately 40% with respect to the width of the region in which the first plating layer 220 is formed, in the direction of line A-A'. Accordingly, the area exposed by the second photosensitive film pattern 120 may be approximately 2.5 times to approximately 5 times greater than the height of the second photosensitive film pattern 120.

Subsequently, the first plating layer 220 is formed on the substrate 100. The first plating layer 220 is grown from the seed layer 210 and is grown through anisotropic plating. Accordingly, the first plating layer 220 is formed in a width and a thickness which are greater than those of the seed layer 210 and accordingly, formed on the seed layer 210 to cover the seed layer 210. For example, the seed layer 210 and the first plating layer 220 may be formed such that the ratio of the width of the seed layer 10 to the width of the first plating layer 220 is approximately 1:1.5 to approximately 1:5. Also, adjacent portions of the plating layer 220 are formed so as not to contact each other. That is, since the first plating layer 220 is formed through anisotropic plating, the first plating layer 220 may be formed inside the second photosensitive film pattern 120 on the seed layer 210 in the vertical direction such that adjacent portions of the first plating layer 220 do not contact each other. Here, the seed layer 210 and the first plating layer 220 may be formed such that the ratio of the distance between the adjacent portions of the seed layer 210 to the width of the first plating layer 220 is approximately 1:1.2 to approximately 1:5. Meanwhile, the first plating film 220 may be formed of, for example, copper, and for this, a plating solution based on, for example, copper sulfate ($CuSO_4$) and sulfuric acid ($H_2SO_4$) may be used. The plating solution may have approximately 100 g/l to approximately 170 g/l content of copper sulfate and approximately 80 g/l to approximately 150 g/l content of sulfuric acid. In this case, the content of copper sulfate may be equal to or greater than the content of sulfuric acid. Furthermore, in order to improve platibility, a ppm-unit content of chlorine (Cl) and a plurality of organic compounds may be added to the plating solution. For example, when 1 liter of plating solution is set to 100 wt %, approximately 0.1 wt % to approximately 0.3 wt % of carrier may be contained, and not more than approximately 0.1 wt % of polish may be contained. Also, in order to maintain anisotropic characteristics, the plating solution may contain polyoxy glycol (ethylene or propylene-based), polyethylene glycol (PEG), or the like. Polyoxy glycol or the like is contained, and thus, the first plating layers 220 may be anisotropically plated while adjacent first plating layers 220 do not contact each other. That is, the plating solution based on copper sulfate and sulfuric acid further contains at least one organic compound, and thereby, the uniformity, electro-deposition property, and polishing property may be improved, and the anisotropic growing property may be maintained. However, when the content of polyoxy glycol or the like is too small, adjacent portions of the first plating layer 220 may contact each other while the first plating layer 220 is grown, and when the content of polyoxy glycol or the like is too great, the growing time of the first plating layer 220 may be increased. Accordingly, the content of polyoxy glycol or the like may be adjusted such that the first plating layer 220 can be grown as early as possible while adjacent portions of the first plating layer 220 do not contact each other. Meanwhile, the plating process for forming the first plating layer 220 may be performed at temperatures of approximately 20° C. to approximately 30° C. Also, since the first plating layer 220 is formed in a small height, the amount of supplying metal ions may be reduced and thus, a low current density of approximately 7 A/cm2 to 15 A/cm2 may be achieved and a plating solution may be supplied from a pump in a flow rate of not more than approximately 1 l/min. Accordingly, the plating layer may be formed even without using an existing high-current rectifying device and a high-output supplying device.

Figure 4:
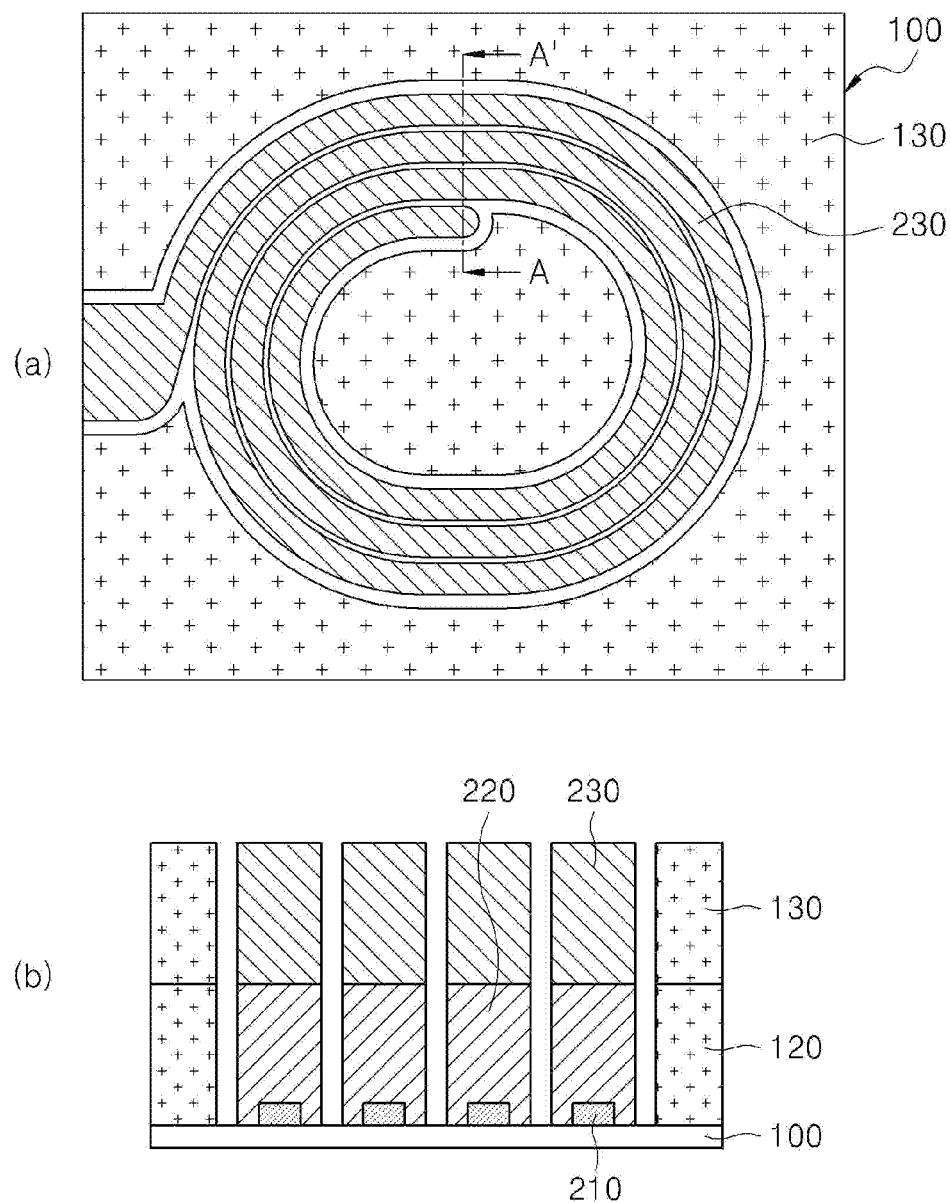

Referring to FIG. 4, a third photosensitive film pattern 130 is formed on the second photosensitive film pattern 120, and then, the second plating layer 230 is formed on the first plating layer 220.

The third photosensitive film pattern 130 may be formed in the same shape as that of the second photosensitive film pattern 120. Also, the third photosensitive film pattern 130 may be formed in the same height as that of the second photosensitive film pattern 120. That is, the third photosensitive film pattern 130 may be formed such that the same photosensitive film as the second photosensitive film pattern 120 is attached and then exposed and developed by using the same exposition mask as the exposition mask of the second photosensitive film pattern 120. Of course, the third photosensitive film pattern 130 may be formed in a height different from that of the second photosensitive film pattern 120, that is, a height higher or lower than that of the second photosensitive film pattern 120. Also, the second plating layer 230 may have a width of at least one region thereof different from that of the first plating layer 220, and in this case, the exposition mask for patterning the third photosensitive film pattern 130 may be different from that for the second photosensitive film pattern 130.

The second plating layer 230 may be formed on the first plating layer 220. In this case, the second plating layer 230 may be formed according to the height of the third photosensitive film pattern 130. That is, the second plating layer 230 may be formed in the same height as that of the first plating layer or may also be formed in a different height. Also, the second plating layer 230 may be formed by using the same plating solution as that for forming the first plating layer 220 and may also be formed under the same condition as that for forming the first plating layer 220. That is, the plating solution is based on copper sulfate and sulfuric acid, and a plurality of organic compounds may be further added. Also, a plating process for forming the second plating layer 230 may be performed at temperatures of approximately 20° C. to approximately 30° C., a low current density of approximately 7 A/cm2 to 15 A/cm2 may be achieved, and a plating solution may be supplied in a flow rate of not more than approximately 1 l/min, and thus, an existing high-output supplying device may not be used.

Figure 5:
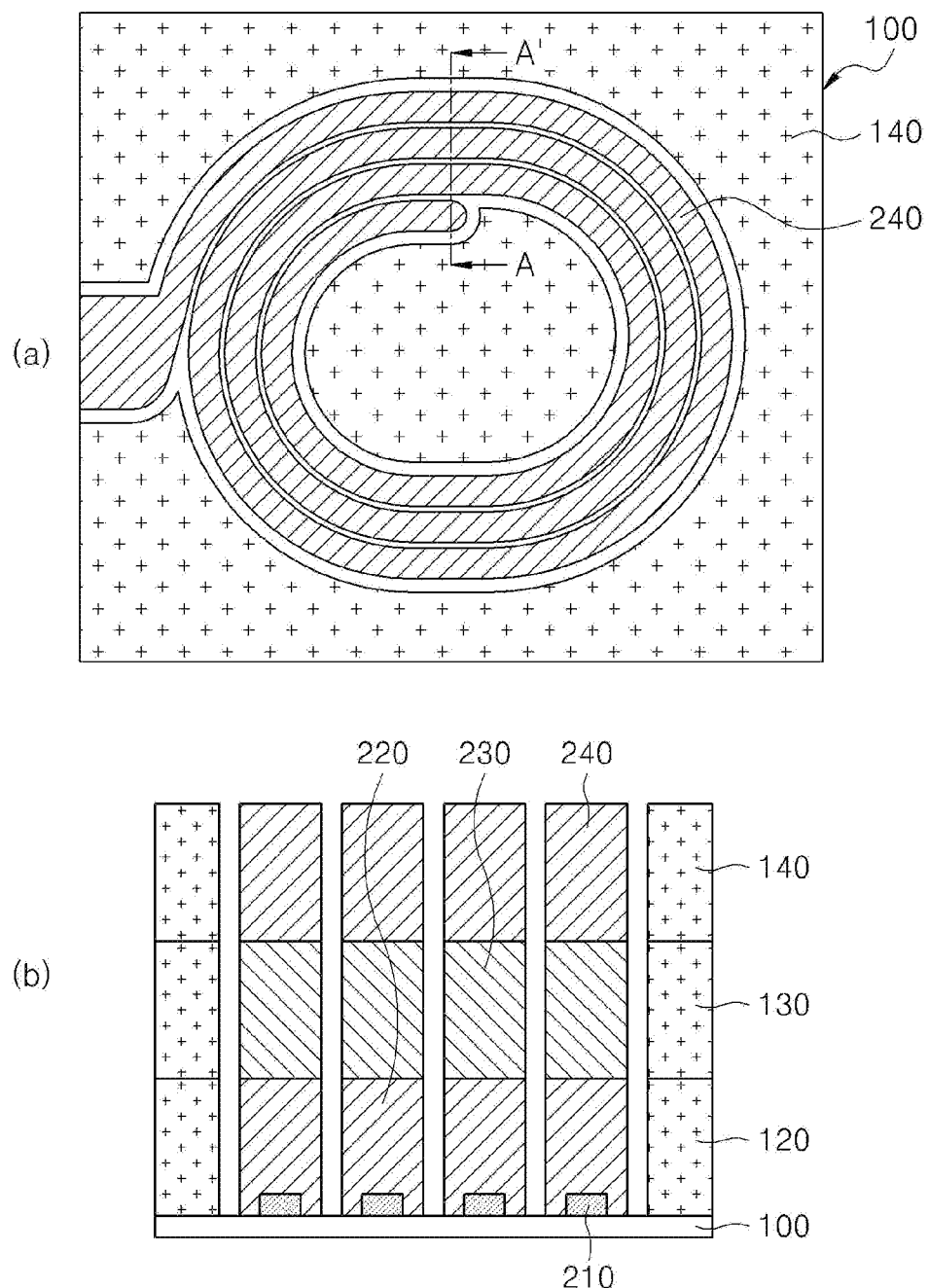

Referring to FIG. 5, a fourth photosensitive film pattern 140 is formed on the third photosensitive film pattern 130, and then, the third plating layer 240 is formed on the second plating layer 230. In this case, the fourth photosensitive film pattern 140 may be formed in the same shape and thickness as those of the third photosensitive film pattern 130. Of course, the fourth photosensitive film pattern 140 may also be formed in a thickness smaller than that of the third photosensitive film pattern 130. Also, the third plating layer 240 may be formed on the second plating layer 230 in a thickness the same as or different from that of the second plating layer 230.

As such, processes for forming the plurality of the photosensitive film patterns and the plurality of plating layers may be performed at least twice, and thus, a coil pattern having a predetermined height and, for example, a spiral shape may be formed. Here, the ratio of the heights of the plurality of photosensitive film patterns 120 to 140 and the widths of the region exposed by the plurality of photosensitive film patterns 120 to 140, that is, the region in which the plurality of plating layers 220 to 240 are formed may be approximately 1:0.5 to 1:2 and may favorably be approximately 1:1. That is, the ratio of the width of the coil pattern formed by laminating the plurality of plating layers 220 to 240 to the heights of the plurality of photosensitive film patterns 120 to 140 may be formed to be approximately 1:1. Of course, the width of the coil pattern may also be greater than the height of the plurality of photosensitive film patterns 120 to 140.

Meanwhile, the ratio of the heights of the second to fourth photosensitive film patterns 120 to 140 to the width of the region which is exposed by the second to fourth photosensitive film patterns 120 to 140, and in which the first to third plating layers 220 to 240 are thereby formed, may be adjusted according to the number of plating layers repetitively laminated. That is, when the plating layer is formed by four processes, the photosensitive film pattern should be formed four times. Therefore, the ratio of the height of each photosensitive film pattern and the width of the region which is exposed by the photosensitive film pattern, and in which the plating layer is formed, may be approximately 0.25:1. That is, the ratio of the total height of the photosensitive film pattern to the width of the plating formation region may finally be approximately 1:1. Of course, the width of the plating formation region may be greater than the total height of the photosensitive film patterns such that the ratio is approximately 1:2. In this case, the height of the photosensitive film pattern and the width of the plating formation region may be adjusted according to the number of lamination of the plating layers.

Figure 6:
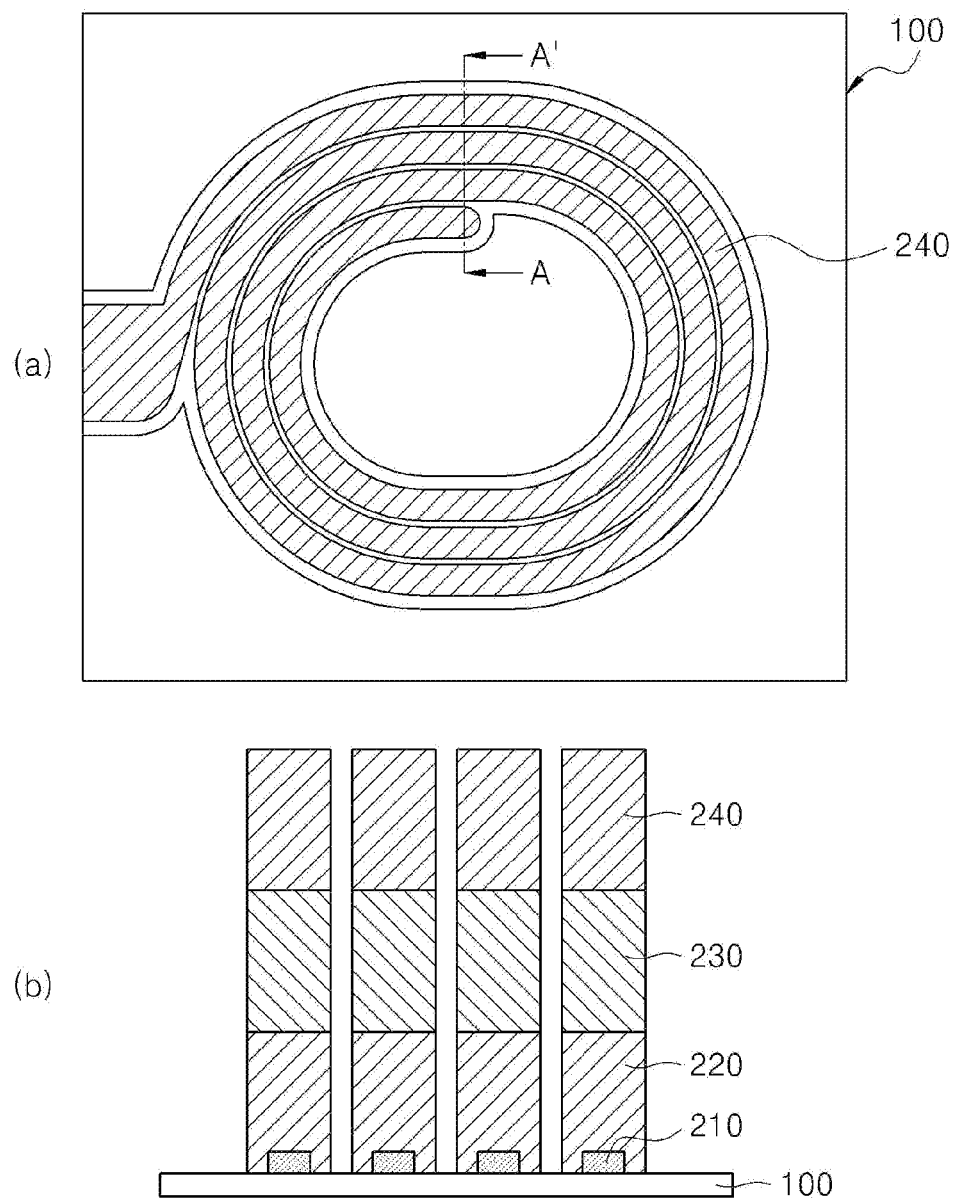
Figure 7:
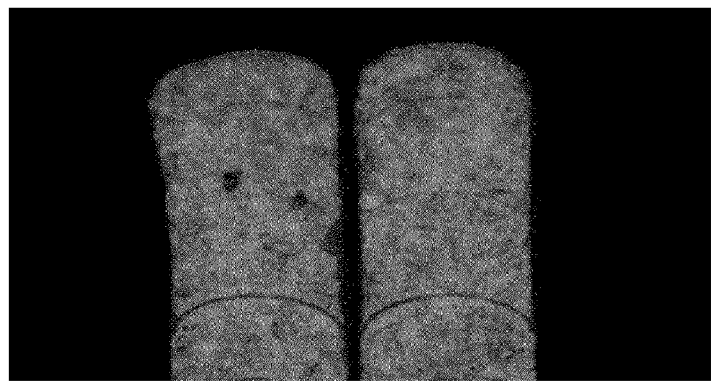
FIG. 7 is a cross-sectional photograph of a central portion of a coil pattern formed in accordance with an exemplary embodiment.

Referring to FIG. 6, the photosensitive film patterns 140, 130, and 120 remaining on the substrate 100 are removed and thus, a coil pattern 200 in which the seed layer 210 and the plurality of plating layers 220, 230, and 240 are laminated may be formed. In this case, the coil pattern 200 may be formed to have an aspect ratio, that is, the ratio of width to height, of approximately 2 to approximately 10. Here, the coil pattern 200 may have a width, which may be the width of the lower surface thereof, the width of the upper surface thereof, or any width between the lower and upper surfaces, or may be the average width. That is, the coil pattern 200 may be formed to have a width-to-height ratio of approximately 1:1.5 to approximately 1:10.

As described above, in the method of forming a coil pattern in accordance with an exemplary embodiment, a seed layer 210 is formed on a substrate, a plurality of plating layers 220, 230, and 240 are formed on the seed layer 210 through anisotropic plating, thereby forming a coil pattern with a predetermined shape. Accordingly, the coil pattern having a high aspect ratio of approximately 2 to approximately 10 may be formed with small amounts of plating solution supplied and consumed. That is, in the exemplary embodiment, the coil pattern may be formed even with a low current density of approximately 7 A/cm2 to approximately 15 A/cm2 and the supply of plating solution of not more than 1 l/min, and thus, anisotropic plating may be realized with a small of amount of supplied plating solution without using an existing high-output plating solution supply device. Thus, since an opened area due to a photosensitive film pattern is greater than the height of the coil pattern, the uniformity of the thickness and shape of plating is excellent, and electrical characteristics of chips may be suitably realized under chip miniaturization trend.

Figure 8:
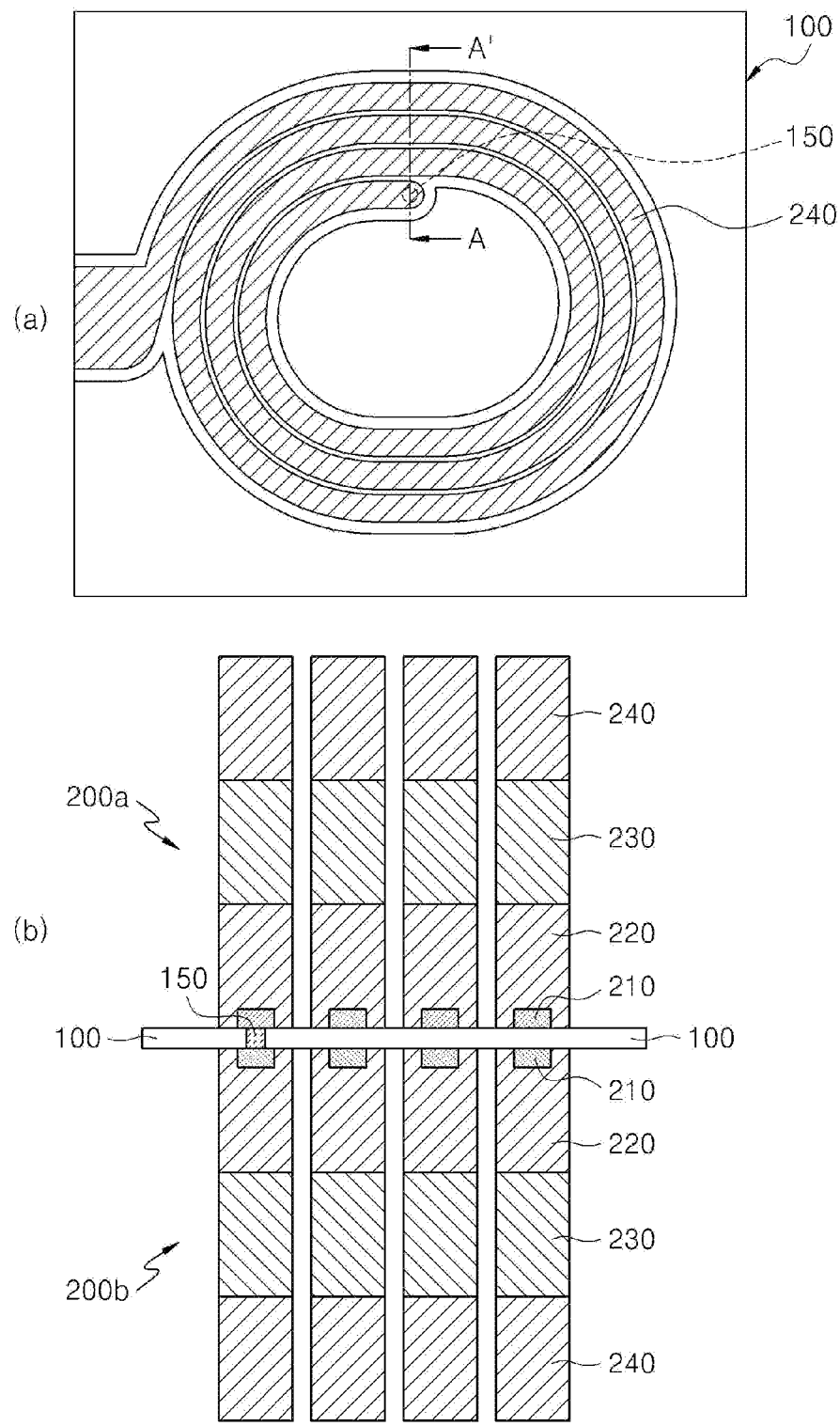
FIGS. 8 to 11 are schematic views of coil patterns in accordance with another exemplary embodiments.

Meanwhile, in the coil pattern in accordance with exemplary embodiments, coil patterns may be formed on both surfaces of a substrate 100. Also, when the coil patterns are formed on both surfaces of the substrate 100, the coil patterns may be connected to each other through a conductive via formed in a predetermined region of the substrate 100. That is, as illustrated in (a) and (b) of FIG. 8, coil patterns 200a and 200b may be respectively formed on the upper and lower surfaces of a substrate 100. Of course, the coil patterns 200a and 200b in which a seed layer 210 and at least two or more plating layers 220, 230 and 240 are stacked and formed may be formed on both surfaces of the substrate 100 through a process as illustrated above in FIGS. 1 to 6 and described. Also, a conductive via 150 is formed in a predetermined region of the substrate 100, and the upper and lower coil patterns 200a and 200b may be connected to each other through the conductive via 150. Here, the conductive via 150 may be formed through a method by forming a via (not shown) passing through the substrate 100 in the thickness direction on the substrate 100, and then allowing the via to be filled when the seed layers 210 are formed, or may also be formed through a method or the like in which the via is filled with a conductive paste. In this case, at least a portion of the seed layers 210 may be grown from the conductive via 150, and accordingly, at least a portion of the conductive via and the seed layers 210 may be integrally formed.

Also, at least a portion of the substrate 100 may be removed. For example, in the substrate 100, remaining regions except for the region overlapping the region in which the coil pattern 200 will be formed later, may be removed. That is, the substrate 100 inside the coil pattern 200 formed in a spiral shape may be removed to form a through hole 160, and the substrate 100 outside the coil pattern 200 may be removed. That is, the substrate 100 may be formed, for example, in a racetrack shape along the outer shape of the coil pattern 200 and in a straight-line shape along the shape of an end portion of the coil pattern 200. In this case, an end portion of the coil pattern 200 formed on one surface of the substrate 100 and an end portion of the coil pattern 200 formed on the other surface of the substrate 100 are formed on regions facing each other, and the end portions of the coil pattern 200 may be connected to an external electrode by being applied later to a power inductor or the like. Meanwhile, when a predetermined region of the substrate 100 except for the region overlapping the coil pattern 200, the substrate 100 may maintain the width greater than that of the coil pattern 200. That is, the substrate 100 may remain in a predetermined width vertically under the coil pattern 200. For example, the substrate 100 may be formed so as to protrude by approximately 0.3 μm from the coil patterns 200a and 200b.

Figure 9:
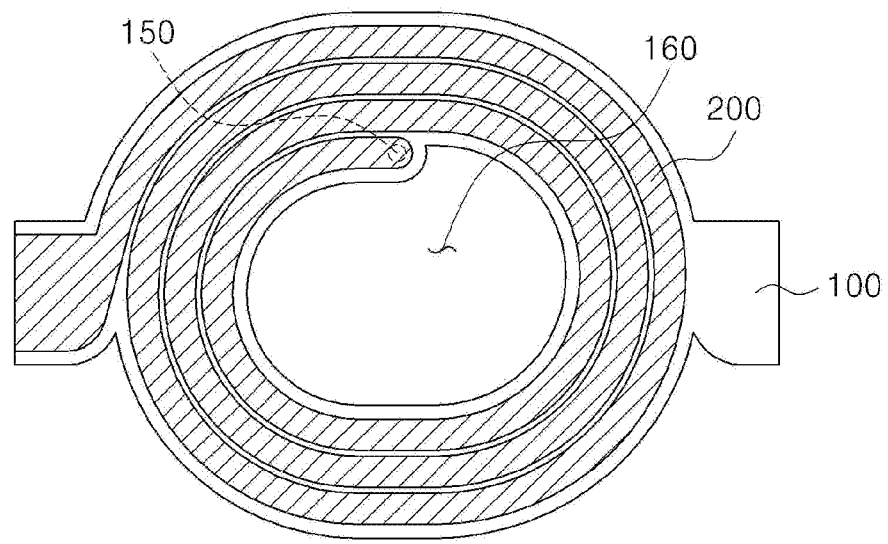
Figure 10:
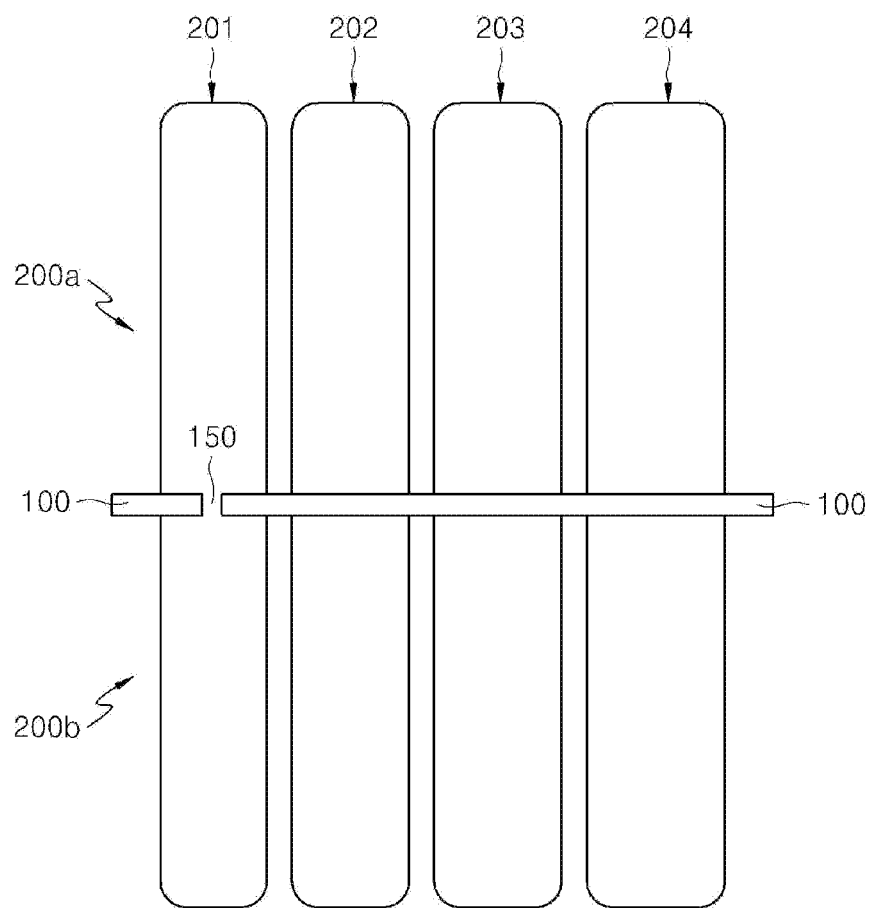

Meanwhile, the coil pattern in accordance with an exemplary embodiment is formed in a spiral shape, and as illustrated in FIG. 10, the coil pattern 200 may be formed in a shape in which the width thereof gradually increases from the innermost periphery toward the outermost periphery. That is, n coil patterns are formed from the innermost periphery to the outermost periphery (the direction of line A-A' of FIG. 1 or 9). For example, when four coil patterns are formed, the widths of the coil patterns may be formed to be gradually increased from the innermost first coil pattern 201 toward second and third coil patterns 202 and 203, and the outermost fourth coil pattern 204. For example, when the width of the first coil pattern 201 is 1, the second coil pattern 202 may be formed in a ratio of approximately 1 to approximately 1.5, the third coil pattern 203 may be formed in a ratio of approximately 1.2 to approximately 1.7, and the fourth coil pattern 204 may be formed in a ratio of approximately 1.3 to approximately 2. Consequently, the second to fourth coil patterns 202, 203, and 204 may be formed in a ratio of approximately 1:1 to approximately 1.5: approximately 1.2 to approximately 1.7: approximately 1.3 to approximately 2. In other words, the width of the second coil pattern 202 may be formed to be equal to or greater than that of the first coil pattern 201, the width of the third coil pattern 203 may be formed to be greater than that of the first coil pattern 201 and equal to or greater than that of the second coil pattern 202, and the width of the fourth coil pattern 204 may be formed to be greater than those of the first and second coil patterns 201 and 202 and equal to or greater than that of the third coil pattern 203. As such, in order to gradually increase the width of the coil pattern the width of the seed layer 210 from the innermost periphery to the outermost periphery, the width of the seed layer 210 may be formed to gradually increase from the innermost periphery to the outermost periphery. Also, the distances between the seed layers 210 may be formed to gradually increase from the innermost periphery to the outermost periphery considering the width of the final coil pattern. Of course, the coil pattern 200 may be formed to have a width gradually decreasing from the innermost periphery toward the outermost periphery. In this case, the distances between the seed layers 210 may be formed to gradually decrease from the innermost periphery to the outermost periphery.

Figure 11:
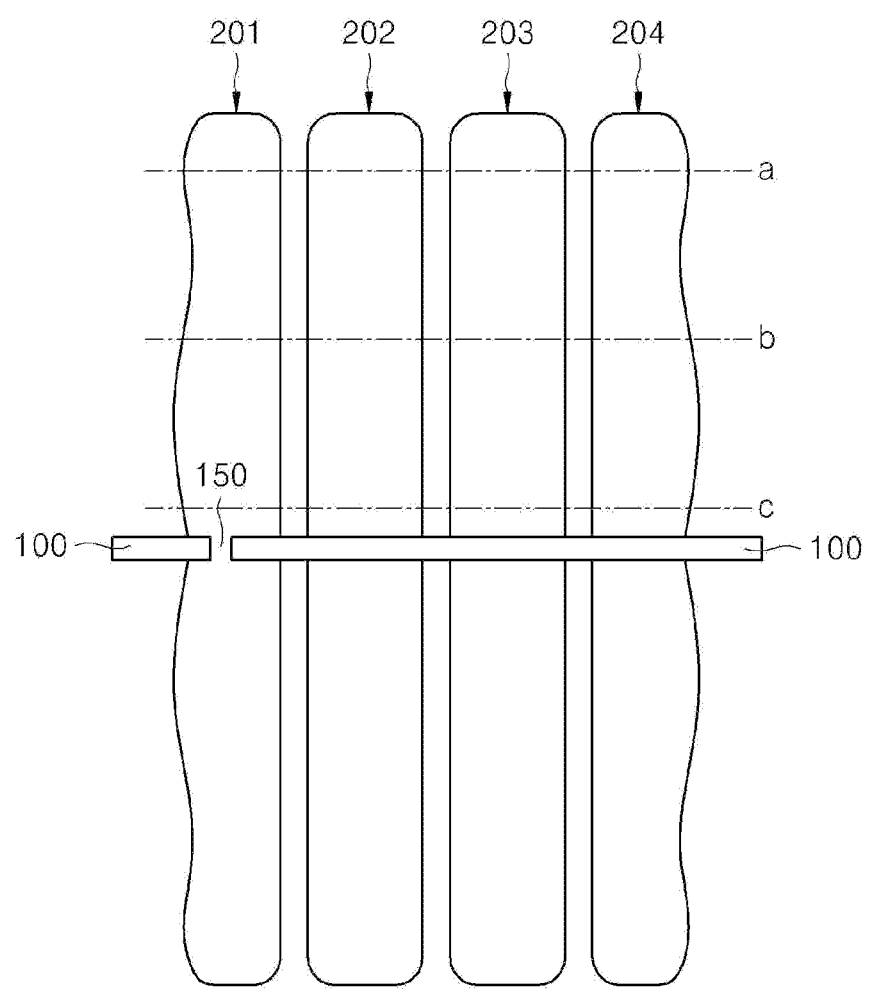

Also, as illustrated in FIG. 11, a coil pattern 200 in accordance of an exemplary embodiment may have at least one portion in which the widths of the upper end portion, a middle portion, and the lower end portion are different. For example, four coil patterns may be formed from the innermost periphery to the outermost periphery, and the innermost and outermost peripheries may be formed to have predetermined inward and outward inclinations. That is, the second and third coil patterns 202 and 203 may have one and the other side surfaces which are vertically formed, the first coil pattern 201 may have one side surface which is adjacent to the second coil pattern 202 and vertically formed, and the fourth coil pattern 204 may have one side surface which is adjacent to the third coil pattern 203 and vertical formed. Also, the first coil pattern 201 may be formed to have one side surface which is not adjacent to the second coil pattern 202 and has one portion with a predetermined inclination, and the fourth coil pattern 204 may be formed to have one side surface which is not adjacent to the third coil pattern 203 and has one portion with a predetermined inclination. In this case, the width a of the upper end portions of the first to fourth coil patterns 201 to 204 may be formed such that: the central coil patterns, that is, the second and third coil patterns 202 and 203 has widths greater than or equal to the width of the outermost coil pattern, that is, the fourth coil pattern 204, and the width of the outermost coil pattern, that is, the fourth coil pattern 204 is greater than the width of the innermost coil pattern, that is, the first coil pattern 201. That is, when the width of the innermost coil pattern is A, the width of the central coil pattern is B, and the width of the outermost coil pattern is C, the upper end portions may be formed in the relationship of B≥C>A. Also, the widths b of the middle portions of the coil patterns 200 may be formed such that: the outermost coil pattern, that is, the fourth coil pattern 204 has a width greater than the width of the central coil patterns, that is, the second and third coil patterns 202 and 203, and the central coil patterns, that is, the second and third coil patterns 202 and 203 have widths greater than or equal to the width of the innermost coil pattern, that is, the first coil pattern 201. That is, when the width of the innermost coil pattern is A, the width of the central coil pattern is B, and the width of the outermost coil pattern is C, the middle portions may be formed in the relationship of C>B≥A. Also, the widths c of the lower end portions of the coil patterns 200 may be formed such that: the outermost coil pattern, that is, the fourth coil pattern 204 has a width greater than the width of the central coil patterns, that is, the second and third coil patterns 202 and 203, and the central coil patterns, that is, the second and third coil patterns 202 and 203 have widths greater than or equal to the width of the innermost coil pattern, that is, the first coil pattern 201. That is, when the width of the innermost coil pattern is A, the width of the central coil pattern is B, and the width of the outermost coil pattern is C, the middle portions may be formed in the relationship of C>B≥A. Here, the lower end portion of the coil pattern may include a first plating layer 220, the middle portion may include a second plating layer 230, and the upper end portion may include a third plating layer 240. That is, when the coil pattern is formed in a plurality of plating layers, the coil pattern may be vertically divided into three equal portions and referred to as a lower end portion, middle portion, and a lower end portion. However, the lower end, middle, and upper end portions may refer to portions formed by photosensitive film patterns with different shapes. Therefore, exemplary embodiments are not necessarily limited to the case of the division into three equal portions. As such, in order to form, in the vertical direction, the different width of at least one region of the coil patterns, the widths of the seed layers 210 and the distances between the photosensitive patterns 120, 130 and 140. For example, in order to form the different widths of the lower end portions, the different widths of the seed layers 210 may be formed, and in order to form the different widths of the middle portions and the upper end portions, the distances between the photosensitive film patterns 120, 130, and 140 may be adjusted. For example, the third photosensitive film pattern 130 formed on the second photosensitive film pattern 120 may be formed to inwardly protrude from the second photosensitive film pattern 120, and the fourth photosensitive film pattern 140 formed on the third photosensitive film pattern 130 may be formed to inwardly protrude from the third photosensitive film pattern 130.

Coil patterns in accordance with the above exemplary embodiments may be used for laminated chip devices. Power inductors will be described below as laminated chip devices which use such coil patterns in accordance with the above exemplary embodiments.

Figure 12:
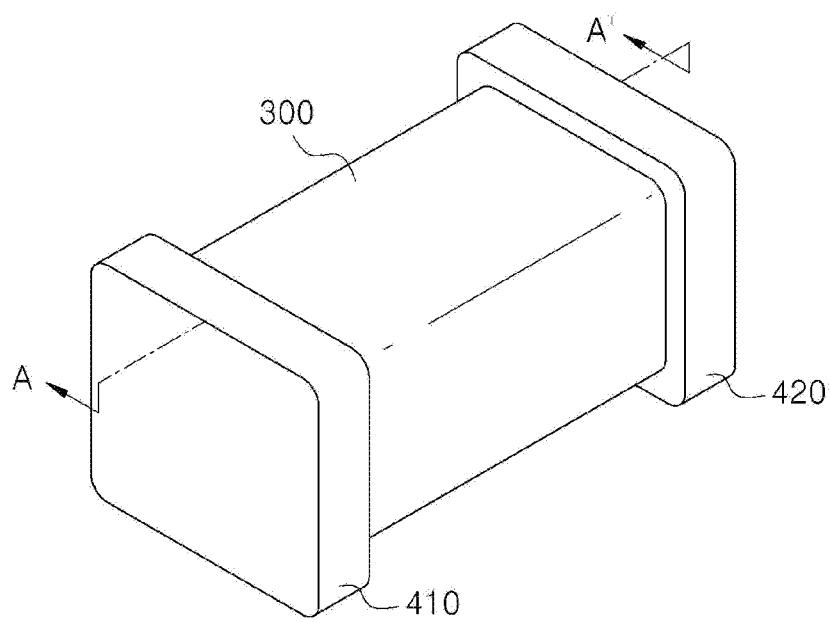
FIGS. 12 to 16 are schematic views for describing chip devices, in which coil patterns in accordance with exemplary embodiments are applied.
Figure 13:
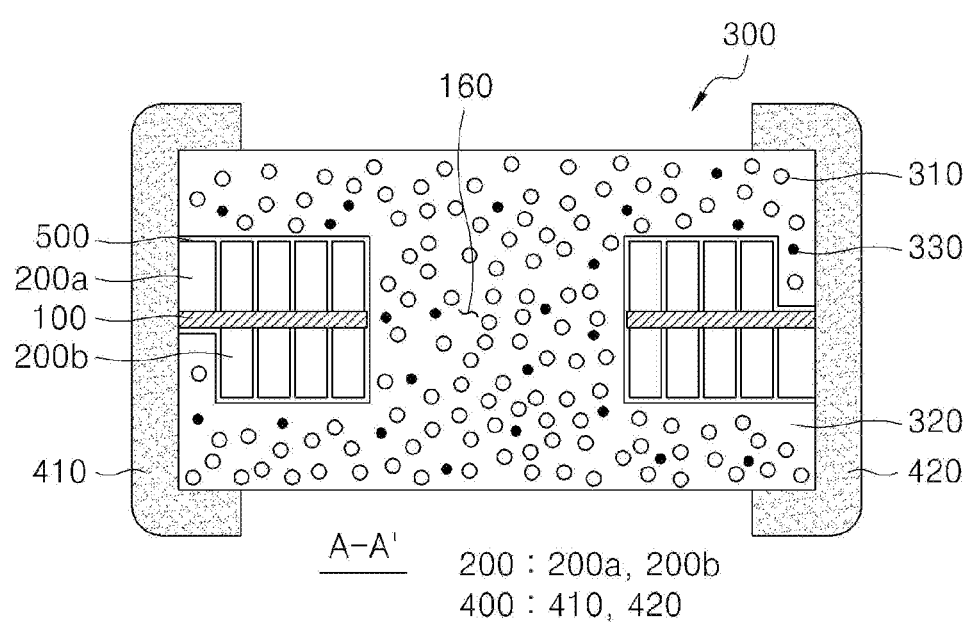
Figure 14:
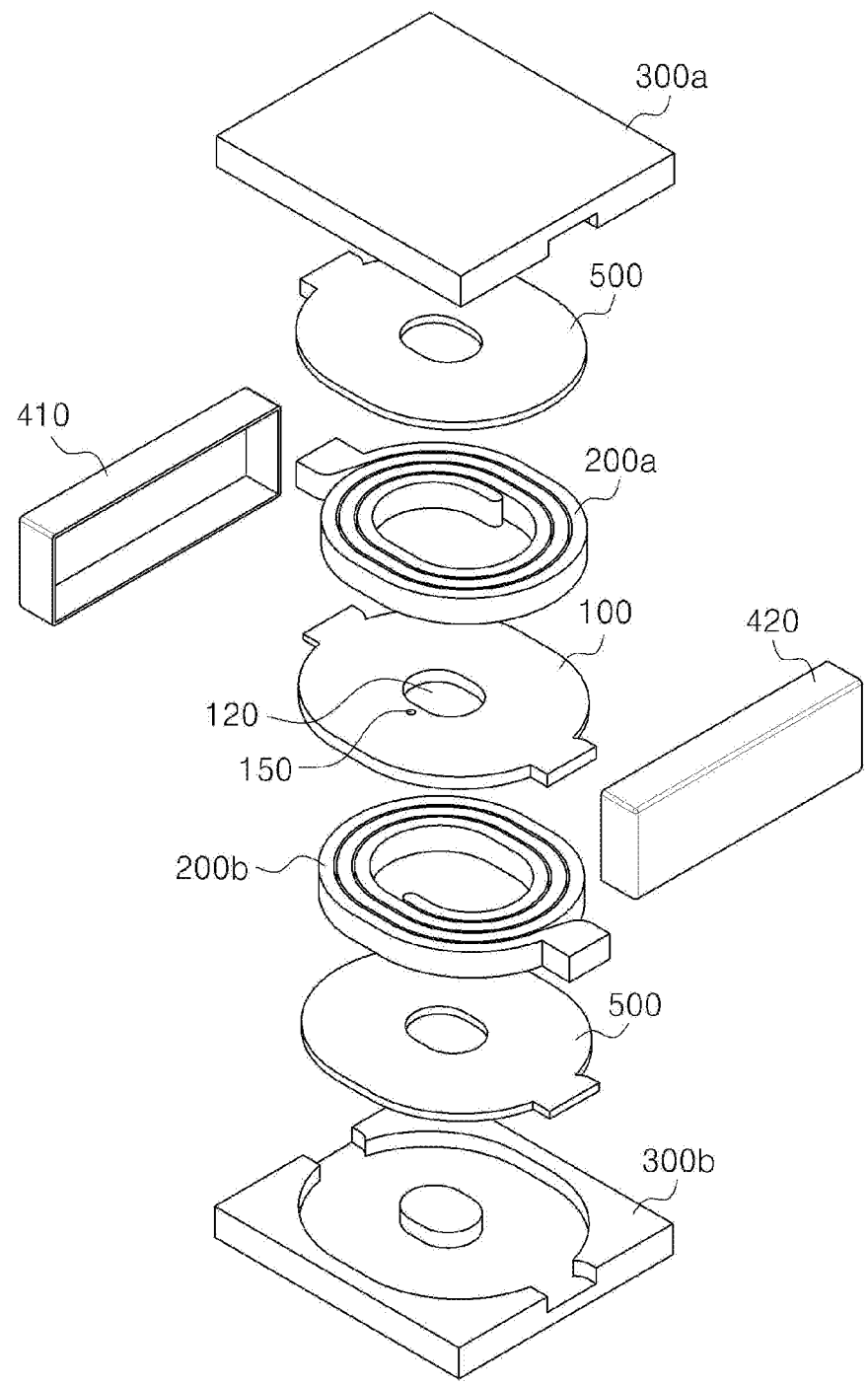
Figure 15:
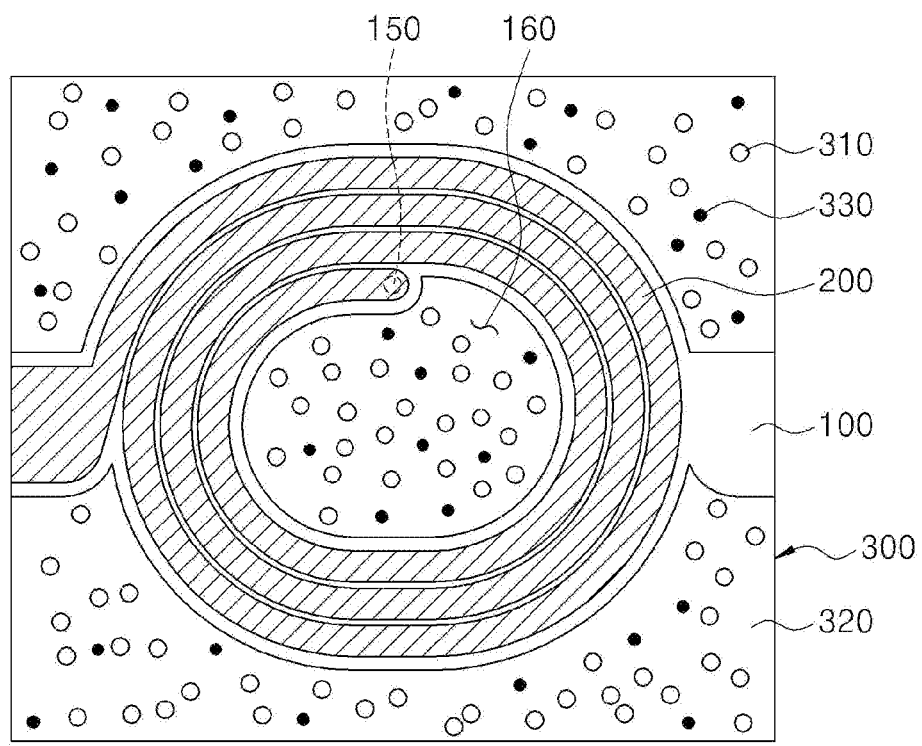
Figure 16:
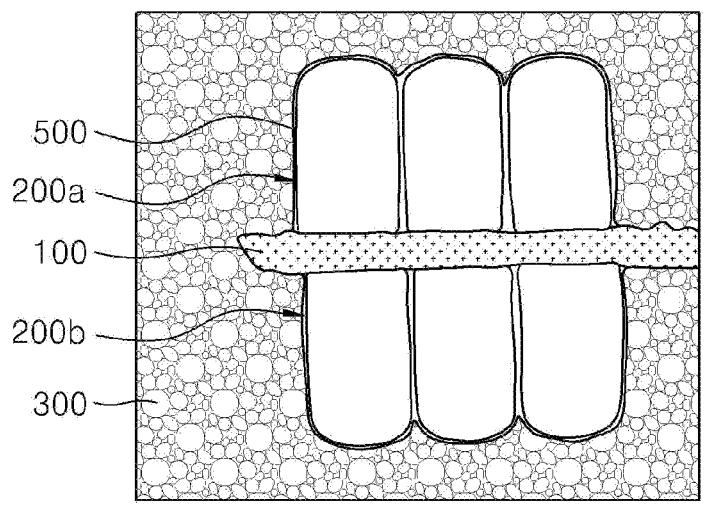

FIG. 12 is a perspective view of a power inductor assembly in accordance with an exemplary embodiment, and FIG. 13 is a cross-sectional view taken along line A-A' of FIG. 12. Also, FIG. 14 is an exploded perspective view of a power inductor in accordance with exemplary embodiment, FIG. 15 is a plan view of a substrate and a coil pattern, and FIG. 16 is a schematic cross-sectional view derived from a cross-sectional photograph of an actual power inductor.

Referring to FIGS. 12 to 16, a power inductor in accordance with exemplary embodiment may include bodies 300a and 300b (300), a substrate 100 provided in the body 300, coil patterns 200a and 200b (200) formed on at least one surface of the substrate 100, and external electrodes 410 and 420 (400) provided outside the body 300. Also, insulating layers 500 may be further included between the coil patterns 200a and 200b and the body 300. The body 300 may have a hexahedral shape. Of course, the body 300 may have a polyhedral shape besides the hexahedral shape. Such a body 300 may include metal powder 310 and a polymer 320, and further include a thermally conductive filler 330.

The metal powder 310 may have the average particle diameter of approximately 1 µm to approximately 50 µm. Also, as the metal powder 310, one kind of particles with the same size or two or more kinds of particles may also be used, and alternatively, one kind of particles with a plurality of sizes or two or more kinds of particles may also be used. For example, a mixture of first metal particles having the average size of approximately 30 µm and second metal particles having the average size of approximately 3 µm may be used. Here, the first and second metal particles may be particles of the same material or different materials. When two or more kinds of metal powders 310 with sizes different from each other are used, it is possible to increase the filling ratio of the body 300. For example, when metal powder with a size of approximately 30 µm is used, voids may be present between the metal powder particles with the size of approximately 30 µm, and accordingly, the filling ratio has no choice but to decrease. However, since metal powder particles with a smaller size of approximately 3 µm are added between the metal powder particles with a size of approximately 30 µm and used, it is possible to increase the filling ratio of the metal powder in the body 300. Metallic materials including iron (Fe) may be used as the metal powder 310. For example, the metallic materials may include one or more metals selected from the group consisting of iron-nickel (Fe—Ni), iron-nickel-silicon (Fe—Ni—Si), iron-aluminum-silicon (Fe—Al—Si) and iron-aluminum-chromium (Fe—Al—Cr). That is, the metal powder 310 may have a have a magnetic structure by including iron or may be formed of a metal alloy exhibiting magnetism and thus, may have predetermined magnetic permeability. Also, the metal powder 310 may have a surface coated with a magnetic material and may be coated with a material having a magnetic permeability different from that of the metal powder 310. For example, the magnetic material may include a metal oxide magnetic material, and one or more oxide magnetic materials selected from the group consisting of a nickel oxide magnetic material, a zinc oxide magnetic material, a copper oxide magnetic material, a manganese oxide magnetic material, a cobalt oxide magnetic material, a barium oxide magnetic material, and a nickel-zinc-copper oxide magnetic material. That is, the magnetic material for coating the surfaces of metal powder 310 may be formed of metal oxides including iron and may favorably have magnetic permeability higher than that of the metal powder 310. Meanwhile, since the metal powder 310 exhibits magnetism, when particles of metal powder 310 contact each other, insulation may be broken, and a short circuit may thereby be caused. Accordingly, the metal powder 310 may have surfaces coated with at least one insulating material. For example, the metal powder 310 may have a surface coated with an oxide or an insulating polymer material, such as parylene, but may favorably be coated with parylene. Parylene may be coated in a thickness of approximately 1 µm to approximately 10 µm. Here, when the parylene is formed in a thickness of less than approximately 1 µm, the insulating effect of the metal powder 310 may be decreased, and when formed in a thickness of greater than approximately 10 µm, the size of the metal powder 310 is increased and thus, the distribution of the metal powder in the body 300 is decreased, and the magnetic permeability of the body 300 may thereby be decreased. Also, the surface of the metal powder 310 may be coated by using various insulating polymer materials besides parylene. Meanwhile, an oxide for coating metal powder 310 may also be formed by oxidizing the metal powder 310, or one selected from $TiO_2$, $SiO_2$, $ZrO_2$, $SnO_2$, NiO, ZnO, CuO, CoO, MnO, MgO, $Al_2O_3$, $Cr_2O_3$, $Fe_2O_3$, $B_2O_3$ or $Bi_2O_3$ may also be applied to coat the metal powder 310. Here, the metal powder 310 may be coated with a double-structure oxide and may be coated with a double structure of an oxide and a polymer material. Of course, the surface of the metal powder 310 may also be coated with an insulating material after being coated with a magnetic material. As such, since the surface of the metal powder 310 is coated with an insulating material, short circuits caused by contact between the particles of metal powder 310 may be prevented. Here, when the metal powder 310 is coated with an oxide, an insulating polymer material, or the like, or even when doubly coated with a magnetic material and an insulating material, the metal powder 310 may be coated in a thickness of approximately 1 µm to approximately 10 µm. The polymer 320 may be mixed with the metal powder 310 to insulate the metal powder particles from each other. That is, the metal powder 310 may have a problem in that eddy current loss under high frequencies and hysteresis loss are increased to thereby cause an increase in material loss. To reduce the material loss, the polymer 320 for insulating particles of the metal powder 310 from each other may be included. Such a polymer 320 may include one or more selected from the group consisting of epoxy, polyimide, and liquid crystalline polymer (LCP), but is not limited thereto. Also, the polymer 320 may be formed of a thermosetting resin for providing insulation between particles of metal powder 310. The thermosetting resin may include, for example, one or more selected from the group consisting of a novolac epoxy resin, a phenoxy-type epoxy resin, a BPA-type epoxy resin, a BPF-type epoxy resin, a hydrogenated BPA epoxy resin, a dimmer acid modified epoxy resin, a urethane modified epoxy resin, a rubber modified epoxy resin, and a DCPD-type epoxy resin. Here, the content of the polymer 320 included may be approximately 2.0 wt % to approximately 5.0 wt % with respect to 100 wt % of metal powder. However, when the content of the polymer 320 is increased, the volume fraction of the metal powder 310 is decreased, and thus, the effect of raising a saturation magnetization value may not be properly realized, and the magnetic permeability of the body 300 may be decreased. Conversely, when the content of the polymer 320 is decreased, a solution of strong acid or strong salt, or the like used in manufacturing process of an inductor penetrates into the inductor, and thus, inductance characteristics of the inductor may be decreased. Accordingly, the polymer 320 may be included within a range which does not decrease the saturation magnetization value and inductance of the metal powder 310. Meanwhile, the body 300 may include a thermally conductive filler 330 to address the problem of the body 300 being heated by external heat. That is, the metal powder 310 in the body 300 may be heated by external heat, and the heat of the metal powder 310 may be discharged to the outside because the thermally conductive filler 330 is included. The thermally conductive filler 330 may include one or more selected from the group consisting of MgO, AlN, and a carbon-based material, but is not limited thereto. Here, the carbon-based material may include carbon and various shapes, for example, may include graphite, carbon black, graphene, graphite, or the like. In addition, the content of thermally conductive filler 330 included may be approximately 0.5 wt % to approximately 3 wt % with respect to 100 wt % of metal powder 310. When the content of the thermally conductive filler 330 is less than the above range, it is impossible to achieve a heat discharge effect, and when the content is greater than the above range, the content of the metal powder 310 is decreased, thereby decreasing the magnetic permeability of the body 300. Furthermore, the thermally conductive filler 330 may have a size of, for example, approximately 0.5 µm to approximately 100 µm. That is, the thermally conductive filler 330 may have the same size as that of the metal powder 310 or a size greater or smaller than the size of the metal powder 310. The thermally conductive filler 330 may have a heat discharge effect which is adjustable according to the size and the content thereof. For example, the greater the size and the content of the thermally conductive filler 330, the higher the heat discharge effect may be. Meanwhile, the body 300 may be manufactured by laminating a plurality of sheets composed of materials including the metal powder 310, the polymer 320, and the thermally conductive filler 330. Here, when the body 300 is manufactured by laminating the plurality of sheets, the content of the thermally conductive filler 330 in each sheet may be different. For example, the farther away from the substrate 100 toward the upper and lower sides, the greater the content of the thermally conductive filler 330 may be. Also, according to needs, the body 300 may be formed by applying various methods, such as a method in which a paste composed of materials including the metal powder 310, the polymer 320, and the thermally conductive filler 330 is printed in a predetermined thickness, or the paste is put into a mold and pressed. Here, in order to form the body 300, the number of laminated sheets or the thickness of the paste to be printed in a certain thickness may be determined as an appropriate number and a thickness considering required electrical characteristics, such as inductance, for a power inductor. Meanwhile, the bodies 300a and 300b provided above and below the substrate 100 with the substrate 100 disposed therebetween may be connected to each other through the substrate 100. That is, at least a portion of the substrate 100 is removed, and the removed portion may be filled with a portion of the body 300. As such, at least a portion of the substrate 100 is removed, and the removed portion is filled with the body 300 such that the area of the substrate 100 is reduced, and the ratio of the body 300 in the same volume is increased. Thus, the magnetic permeability of the power inductor may be increased.

The substrate 100 may be provided in the body 300. For example, the substrate 100 may be provided in the body 300 in the direction of the longitudinal axis of the body 300, that is, in the direction toward the external electrode 400. Also, one or more substrates 100 may be provided. For example, two or more substrates 100 may be provided so as to be spaced a predetermined distance apart from each other in the direction perpendicular to the direction in which the external electrode 400 is formed, for example, in the vertical direction. Of course, two or more substrates 100 may also be arranged in the direction in which the external electrode 400 is formed. Such a substrate 100 may be formed of, for example, copper clad lamination (CCL), metal ferrite, or the like. Here, since being formed of metal ferrite, the substrate 100 may have increased magnetic permeability and capacity which is easily achieved. That is, since CCL does not have magnetic permeability, CCL may decrease the magnetic permeability of a power inductor. However, when metal ferrite is used for the substrate 100, since having magnetic permeability, the metal ferrite does not decrease the magnetic permeability of the power inductor. Such a substrate 100 using the metal ferrite may be formed by bonding a copper foil to a plate with a predetermined thickness, the plate being formed of one or more metals selected from the group consisting of iron-nickel (Fe—Ni), iron-nickel-silicon (Fe—Ni—Si), iron-aluminum-silicon (Fe—Al—Si), and iron-aluminum-chromium (Fe-al-Cr). That is, the substrate 100 may be manufactured such that an alloy composed of at least one metal including iron is formed into a plate shape with a predetermined thickness, and a copper foil is bonded to at least one surface of a metal plate. Also, at least one conductive via (not shown) may be formed in a predetermined region of the substrate 100, and coil patterns 200a and 200b (200) respectively formed above and below the substrate 100 may be electrically connected through the conductive via. Also, at least a portion of the substrate 100 may be removed. That is, as illustrated in FIGS. 14 and 15, in the substrate 100, the remaining region except for the region overlapping the coil pattern 200 may be removed. For example, the substrate 100 inside the coil pattern 200 formed in a spiral shape may be removed to form a through hole 160, and the substrate 100 outside the coil pattern 200 may be removed. That is, the substrate 100 may be formed, for example, in a racetrack shape along the outer shape of the coil pattern 200, and the region facing the external electrode 400 may be formed in a straight-line shape along the shape of end portions of the coil pattern 200. Accordingly, the outer side of the substrate 100 may be provided in a curved shape with respect to the body 300. The portion from which the substrate 100 is removed as described above may be filled with the body 300 as illustrated in FIG. 15. That is, the upper and lower bodies 300a and 300b are connected to each other through the removed region including the through hole 160 in the substrate 100. Meanwhile, when the substrate 100 is formed of metal ferrite, the substrate 100 may contact the metal powder 310 of the body 300. To address such a problem, an insulating layer 500, such as parylene, may be formed on side surfaces of the substrate 100. For example, the insulating layer 500 may be formed on the side surface of the through hole 160 and the outer side surfaces of the substrate 100. Meanwhile, the substrate 100 may be provided in a width wider than the coil pattern 200. For example, the substrate 100 may remain in a predetermined width vertically under the coil pattern. For example, the substrate 100 may be formed so as to protrude by approximately 0.3 µm from the coil pattern 200. Meanwhile, the substrate 100 may have an area smaller than that of the horizontal cross-section of the body 300 because the regions inside and outside the coil pattern are removed. For example, when the area of the horizontal cross-section of the body 300 is set to 100, the substrate 100 may be provided in an area of approximately 40 to approximately 80. When the area ratio of the substrate 100 is high, the magnetic permeability of the body 300 may be decreased, and when the area ratio of the substrate 100 is low, the formation area of the coil patterns 200a and 200b may be decreased. Accordingly, the area ratio of the substrate 100 may be adjusted considering the magnetic permeability of the body 300, the line widths and turn numbers of the coil patterns 200a and 200b.

The coil patterns 200a and 200b (200) may be formed on at least one surface of the substrate 100 and may favorably be formed on both surfaces of the substrate 100. Such a coil pattern 200 may be formed in a spiral shape in the outward direction from a predetermined region, for example, from the central portion of the substrate 100, and the two coil patterns 200a and 200b formed on the substrate 100 may be connected to form one coil. That is, the coil pattern 200 may be formed in a spiral shape from the outer side of the through hole 160 formed on the central portion of the substrate 100 and may be connected to each other through a conductive via formed in the substrate 100. Here, the upper coil pattern 200a and the lower coil pattern 200b may be formed in the same shape as each other and may be formed in the same height as each other. Also, the coil patterns 200a and 200b may also be formed to overlap each other, and the coil pattern 200b may also be formed in a region in which the coil pattern 200a has not been formed. Meanwhile, end portions of the coil patterns 200a and 200b may outwardly extend in a straight-line shape and may extend along the central portion of a short side of the body 300. Also, the region which is in the coil pattern 200 and contacts the external electrode 400 is formed to have a width greater than those of other regions, as illustrated in FIGS. 14 and 15. Since a portion of the coil pattern 200, that is, a lead-out part, is formed in a greater width, the contact area between the coil pattern 200 and the external electrode 400 may be increased, and resistance may thereby be reduced. Of course, the coil pattern 200 may extend in the widthwise direction of the external electrode 400 in one region in which the external electrode 400 is formed. Here, an end portion of the coil pattern, that is, the lead-out part led out toward the external electrode 400, may be formed in a straight-line shape toward the central portion of the side surface of the body 300. Also, the coil pattern 200 may be formed by laminating a seed layer 210 and a plurality of plating layers 220, 230, and 240, and the plurality of plating layers 220, 230, and 240 may be formed from the seed layer 210 through anisotropic plating.

The external electrodes 410 and 420 (400) may be formed on two surfaces of the body 300, the two surfaces facing each other. For example, the external electrode 400 may be formed on two surfaces facing each other in the longitudinal axis direction of the body 300. Such an external electrode 400 may be electrically connected to the coil patterns 200a and 200b of the body 300. Also, the external electrode 400 may be formed on the entire two surfaces of the body 300 and may be brought into contact with the coil patterns 200a and 200b in the central portions of the two side surfaces. That is, the end portions of the coil pattern 200 are exposed to the outer central portions of the body 300, and the external electrode 400 is formed on the side surfaces of the body 300 and may thereby be connected to the end portions of the coil patterns 200a and 200b. Such an external electrode 400 may be formed on both ends of the body 300 through various methods, such as a method in which the body 300 is immersed in a conductive paste, or a method of printing, deposition, or sputtering. The external electrode 400 may be formed of a metal having electrical conductivity, for example, may be formed on one or more selected from the group consisting of gold, silver, platinum, copper, nickel, palladium, and an alloy thereof. Also, the external electrode 400 may have a surface on which nickel-plated layer (not shown) or tin-plated layer (not shown) is further formed.

The insulating layer 500 may be formed between the coil pattern 200 and the body 300 to insulate the coil patterns 200 and the metal powder 310. That is, the insulating layer 500 may be formed to cover the upper and side surfaces of the coil pattern 200. In addition, the insulating layer 500 may also be formed to cover not only the upper and side surfaces of the coil pattern 200 but also the substrate 100. That is, the insulating layer 500 may also be formed on the exposed region of the substrate 100 other than the coil pattern 200, that is, on the surface and side surfaces of the substrate 100. The insulating layer 500 on the substrate 100 may be formed in the same thickness as that of the insulating layer 500 on the coil pattern 200. Such an insulating layer 500 may be formed by coating the coil pattern 200 with parylene. For example, a substrate 100 on which coil pattern 200 are formed is provided in a deposition chamber, parylene is then vaporized to thereby be supplied into a vacuum chamber. Thus, parylene may be deposited on the coil pattern 200. For example, parylene is firstly heated in a vaporizer to be vaporized and thereby converted into a dimmer state, is then secondly heated to be thermally decomposed into a monomer state, is then cooled by using a cold trap and a mechanical vacuum pump which are connected to the deposition chamber, and then is converted into a polymer state from the monomer state to be thereby deposited on the coil pattern 200. Of course, the insulating layer 500 may be formed of an insulating polymer besides parylene, for example, one or more materials selected from polyimide and liquid crystalline polymer. However, the insulating layer 500 may be formed in a uniform thickness on the coil pattern 200 by applying parylene, and even when the formed thickness is small, insulating characteristics may be improved in comparison with those of other materials. That is, when parylene is applied as an insulating layer 500, the insulating characteristics may be improved because the dielectric breakdown voltage is increased while a smaller thickness than that in the case of forming polyimide is formed. Also, the insulating layer 500 may be formed in a uniform thickness by filling gaps between patterns according to the distances among the patterns of the coil patterns 200 or may be formed in a uniform thickness along steps of the patterns. That is, when the distances between the patterns of the coil pattern 200 are large, parylene may be applied in a uniform thickness along the steps of the patterns, and when the distances between the patterns are small, parylene may be applied in a predetermined thickness on the coil patterns 200 and 220 by filling the gap between the patterns. As illustrated in FIG. 16, parylene is formed in a small thickness along the steps of the coil patterns 200 and 220, but polyimide is formed in a greater thickness than that in case of parylene. Meanwhile, the insulating layer 500 may be formed in a thickness of approximately 3 µm to approximately 100 µm by using parylene. When parylene is formed in a thickness less than approximately 3 µm, insulation characteristics may be decreased, and when formed in a thickness greater than approximately 100 µm, the thickness occupied by the insulating layer 500 in the same size is increased. Thus, the volume of the body 300 is decreased, and thereby, magnetic permeability of the body 300 may be decreased. Of course, the insulating layer 500 may be manufactured in a sheet with a predetermined thickness and then formed on the coil patterns 200a and 200b.

As described above, a power inductor in accordance with an exemplary embodiment may prevent the temperature of a body 300 from rising because the body 300 is manufactured to include not only metal powder 310 and a polymer 320 but also a thermally conductive filler 330 and is thereby capable of discharging heat of the body 300 due to heating of the metal powder 310. Thus, the problem of decrease in inductance may be prevented. In addition, an insulating layer 500 is formed by using parylene between a coil pattern 200 and the body 300, and thus, insulation characteristics may be improved while the insulating layer 500 is formed in a small and uniform thickness on the side and upper surfaces of the coil pattern 200. In addition, the magnetic permeability of the power inductor may be prevented from decreasing by forming a substrate 100 inside the body 300 by using metal magnetic materials, and the magnetic permeability of the power inductor may be improved by removing at least a portion of the substrate 100 and filling the portion with the body 300.

Meanwhile, the power inductor in accordance with exemplary embodiments may be further provided with at least one ferrite layer (not shown) in the body 300. That is, a ferrite layer may be provided on at least any one of upper and lower surfaces of the body 300, and at least one ferrite layer may also be provided in the body 300 so as to be spaced apart from the substrate 100. Such a ferrite layer may be manufactured in a sheet shape and may be provided in the body in which a plurality of sheets are laminated. That is, at least one ferrite layer may be provided between the plurality of sheets for manufacturing the body 300. Also, when the body 300 is formed by printing, in a certain thickness, a paste composed of materials including the metal powder 310, the polymer 320, and the thermally conductive filler 330, the ferrite layer may be formed during printing, and when the paste is put into a mold and pressed, the ferrite layer may be put into paste and pressed. Of course, the ferrite layer may also be formed by using a paste, and the ferrite layer maybe formed in the body 300 by applying a soft magnetic material during printing on the body 300. As such, the magnetic permeability of the power inductor may be improved by providing at least one ferrite layer on the body 300.

Also, at least two or more substrates 100 on which a coil pattern 200 is formed on at least one surface thereof may be provided in the body 300 so as to be spaced apart from each other, and the coil pattern 200 formed on the substrates 100 different from each other may be connected through an external electrode (not shown). Accordingly, a plurality coil patterns may be formed in one body 300, and thus, the capacity of the power inductor may be increased. That is, the coil patterns 200 respectively formed on the substrates 100 different from each other may be connected in series by using the external connection electrode, and thus, the capacity of the power inductor may be increased in the same area.

Of course, at least two or more substrates 100 are horizontally arranged, and coil patterns 200 respectively formed on the substrates 100 are then connected through external electrodes 400 different from each other. Accordingly, a plurality of inductors may be provided in parallel. Thus, two or more power inductors may also be realized in one body 300. That is, a plurality of inductors may be realized in one body 300.

In addition, a plurality of substrates 100 on which coil patterns 200 are respectively formed at least one surface of the substrate 100 may be laminated in the thickness direction (that is, the vertical direction) of the body 300 or may be arranged in the direction (that is, the horizontal direction) perpendicular to the thickness direction. In addition, the coil patterns 200 respectively formed on the plurality of substrates 100 may be connected to the external electrodes 400 in series or in parallel. That is, the coil patterns 200 respectively formed on the plurality of substrates 100 may be connected to the external electrodes 400 different from each other in parallel, and the coil patterns 200 respectively formed on the plurality of substrates 100 may be connected to the same external electrode 400 in series. When connected in series, the coil patterns 200 respectively formed on the respective substrates 100 may be connected through the external electrodes of the body 300. Accordingly, when being connected in parallel, two external electrodes 400 are necessary for each of the plurality of substrates 100, and when being connected in series, two external electrodes 400 are necessary regardless of the number of the substrates, and one or more connection electrodes are necessary. For example, when coil patterns 200 formed on three substrates 100 are connected in parallel to external electrodes 400, six external electrodes 400 are necessary, and when coil patterns 200 formed on three substrates 100 are connected in series to external electrodes 400, two external electrodes 400 and at least one connection electrode are necessary. Also, when connected in parallel, a plurality of coils are provided in a body 300, and when connected in series, one coil is provided in the body 300.

The present invention may, however, be embodied in different forms and should not be construed as limited to the embodiments set forth herein. That is, the above embodiments are provided so that this disclosure will be thorough and complete, and will fully convey the scope of the present invention to those skilled in the art. The scope of the present invention should be interpreted by attached claims.

The invention claimed is:

1. A method of forming a coil pattern on at least one surface on a substrate, the method comprising:
    forming a seed layer on at least one surface of a substrate; and
    forming at least two or more plating layers to cover the seed layer, wherein
    the two or more plating layers are formed through anisotropic plating.

2. The method of claim 1, wherein the seed layer is formed in a spiral shape.

3. The method of claim 2, wherein said at least two or more plating layers are formed after at least two or more photosensitive film patterns are respectively formed on the substrate so as to be spaced apart from innermost and outermost sides of the seed layer.

4. The method of claim 3, wherein a ratio of a height of said at least two or more photosensitive film patterns to a total width of said at least two or more plating layers is approximately 1:0.5 to 1:2.

5. The method of claim 3, wherein the coil pattern is formed in an aspect ratio of approximately 2 to approximately 10.

6. The method of claim 5, wherein the coil pattern has at least one region formed in a different width.

7. The method of claim 6, wherein the coil pattern is formed to have a width gradually increasing or decreasing from an innermost side toward an outermost side.

8. The method of claim 7, wherein the coil pattern has at least one region formed to have widths different from each other in lower end portion, middle portion, and upper end portion of the region.

9. A coil pattern formed by the method set forth in claim 1, and comprising:
    a seed layer formed on at least one surface of a substrate; and
    at least two or more plating layers formed to cover the seed layer and formed through an anisotropic plating process performed at least twice.

10. The coil pattern of claim 9, wherein the coil pattern is formed to have a width gradually increased or decreased from an innermost side thereof toward an outermost side thereof.

11. The coil pattern of claim 10, wherein the coil pattern has at least one region formed to have widths different from each other in lower end portion, middle portion, and upper end portion of the region.

12. The coil pattern of claim 11, wherein when a width of an innermost portion of the coil pattern is A, a width of a central portion of the coil pattern is B, a width of an outermost portion of the coil pattern is C, the upper end portion is formed to have a relationship B≥C>A, the middle portion is formed to have a relationship C>B≥A, and the lower end portion is formed in a relationship C>B≥A.

13. A chip device comprising:
    a body;
    at least one substrate provided in the body;
    at least one coil pattern formed on at least one surface of the substrate; and
    an insulating layer formed between the coil pattern and the body, wherein
    the coil pattern comprises a seed layer formed on at least one surface of the substrate and at least two or more plating layers formed to cover the seed layer and formed through an anisotropic process performed at least twice.

14. The chip device of claim 13, wherein at least some regions of the substrate are removed and the removed regions are filled with the body.

15. The chip device of claim 13, wherein the coil pattern is formed to have a width gradually increased or decreased from an innermost side thereof toward an outermost side thereof.

16. The chip device of claim 13, wherein when a width of an innermost portion of the coil pattern is A, a width of a central portion of the coil pattern is B, a width of an outermost portion of the coil pattern is C, the upper end portion is formed to have a relationship B C>A, the middle portion is formed to have a relationship C>B≥A, and the lower end portion is formed in a relationship C>B≥A.

17. The chip device of claim 13, wherein at least two substrates are provided to be laminated in a thickness direction of the body, and coil patterns respectively formed on the two or more substrates are connected in series or in parallel.

18. The chip device of claim 14, wherein the coil pattern is formed to have a width gradually increased or decreased from an innermost side thereof toward an outermost side thereof.

19. The chip device of claim 14, wherein when a width of an innermost portion of the coil pattern is A, a width of a central portion of the coil pattern is B, a width of an outermost portion of the coil pattern is C, the upper end portion is formed to have a relationship B≥C>A, the middle portion is formed to have a relationship C>B≥A, and the lower end portion is formed in a relationship C>B≥A.

20. The chip device of claim 14, wherein at least two substrates are provided to be laminated in a thickness direction of the body, and coil patterns respectively formed on the two or more substrates are connected in series or in parallel.

* * * * *